United States Patent [19]

Munch

[11] 4,176,575

[45] Dec. 4, 1979

[54] IMPROVED TOUCH OPERATED CAPACITANCE SWITCH CIRCUIT FOR AN ELECTRONIC ORGAN

[75] Inventor: Walter Munch, Fort Thomas, Ky.

[73] Assignee: D. H. Baldwin & Company, Cincinnati, Ohio

[21] Appl. No.: 808,607

[22] Filed: Jun. 21, 1977

[51] Int. Cl.² ........................ G10H 1/00; G10H 5/00
[52] U.S. Cl. ................... 84/1.01; 84/DIG. 7; 200/52 R; 200/DIG. 1; 340/365 C; 361/283
[58] Field of Search ................... 84/1.01, DIG. 7; 200/52 R, DIG. 1; 340/365 C; 361/283, 281

[56] References Cited

U.S. PATENT DOCUMENTS

| | | | |
|---|---|---|---|
| 2,878,708 | 3/1959 | Hanert | 84/DIG. 7 |
| 3,324,647 | 6/1967 | Jedynak | 361/200 X |
| 3,492,440 | 1/1970 | Cerbone et al. | 200/DIG. 1 |
| 3,641,410 | 2/1972 | Vogelsberg | 200/DIG. 1 |
| 3,836,909 | 9/1974 | Cockerell | 340/365 C |
| 3,879,644 | 4/1975 | Maltby | 361/280 X |
| 3,943,812 | 3/1976 | Nagai et al. | 84/DIG. 7 |

Primary Examiner—Stanley J. Witkowski
Attorney, Agent, or Firm—Kirkland & Ellis

[57] ABSTRACT

Disclosed is a touch operated capacitance switch which may be used in connection with a digital arpeggio system for an electronic organ that through the use of digital techniques permits arpeggios, note sequences as well as strum, multi, organ, and normal modes of operation to be played automatically. Two counters scan by counting through an 8×8 matrix of 64 words covering the 61 notes of an organ in rapid sequence upon the playing of one or more organ keys. Each word is fed to a corresponding one of 61 decoders, one for each note of the keyboard. If a corresponding key has been played, the decoder provides a signal to a corresponding pulser circuit which enables a corresponding keyer to transmit an audio signal from an audio oscillator corresponding to the played key to an output system and loudspeaker. The two counters are stopped by a clock control while the note is sounded and then the counters are enabled by the counter control to continue counting through the matrix until the next actuated key is located. The two counters can be controlled to count up only, or up and down so that both and up and an up-down arpeggio can be sounded. A sequence control is also provided so that the sequence of the sounding of the played notes can be varied by changing the pattern of the words supplied by the two counters so that the notes can be sounded out of their normal chromatic order. The system also permits normal mode of operation so that the notes are sounded as the keys are played, multi mode so that octavely related notes are sounded or a strum mode simulating the strum of a guitar or banjo strings. The touch operated capacitance switch provided is so that the organist can change the mode of operation rapidly during playing by maintaining physical contact with the capacitance touch switch.

3 Claims, 20 Drawing Figures

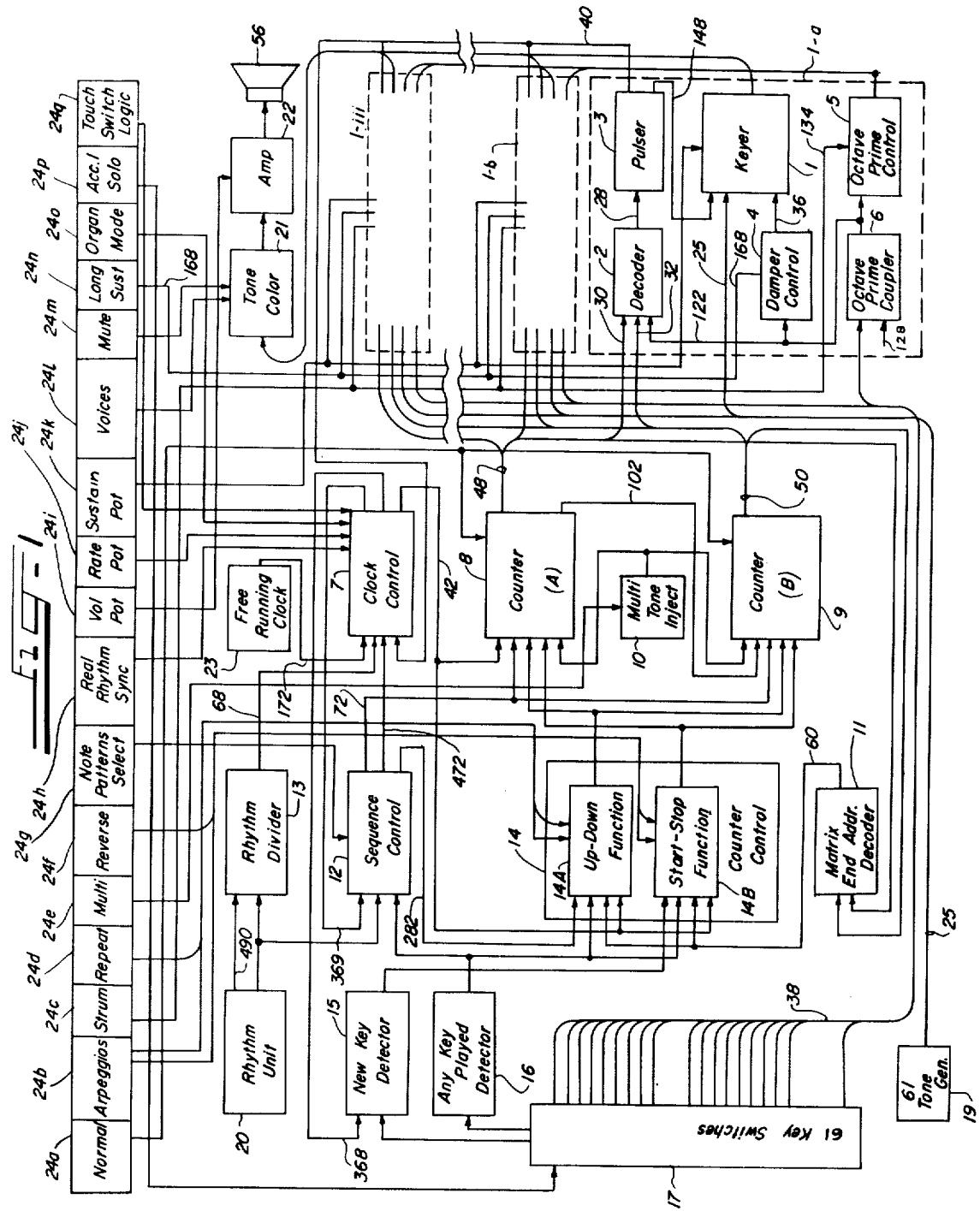

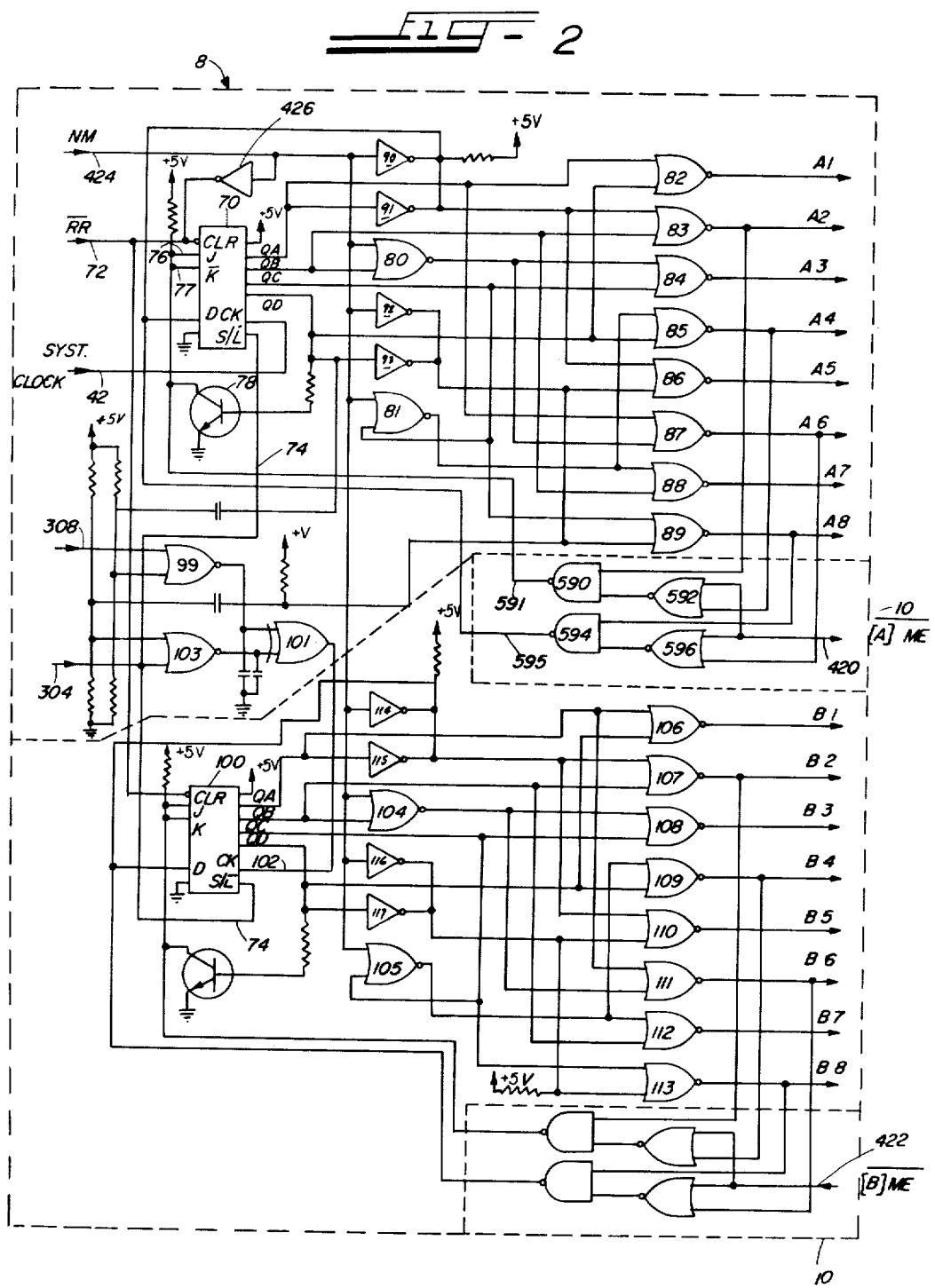

|  | A1 | A2 | A3 | A4 | A5 | A6 | A7 | A8 |
|---|---|---|---|---|---|---|---|---|
| B1 |  |  | C2 | C2# | D2 | D2# | E2 | F2 |
| B2 | F2# | G2 | G2# | A2 | A2# | B2 | C3 | C3# |
| B3 | D3 | D3# | E3 | F3 | F3# | G3 | G3# | A3 |
| B4 | A3# | B3 | C4 | C4# | D4 | D4# | E4 | F4 |
| B5 | F4# | G4 | G4# | A4 | A4# | B4 | C5 | C5# |
| B6 | D5 | D5# | E5 | F5 | F5# | G5 | G5# | A5 |
| B7 | A5# | B5 | C6 | C6# | D6 | D6# | E6 | F6 |
| B8 | F6# | G6 | G6# | A6 | A6# | B6 | C7 |  |
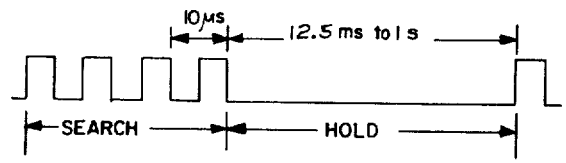

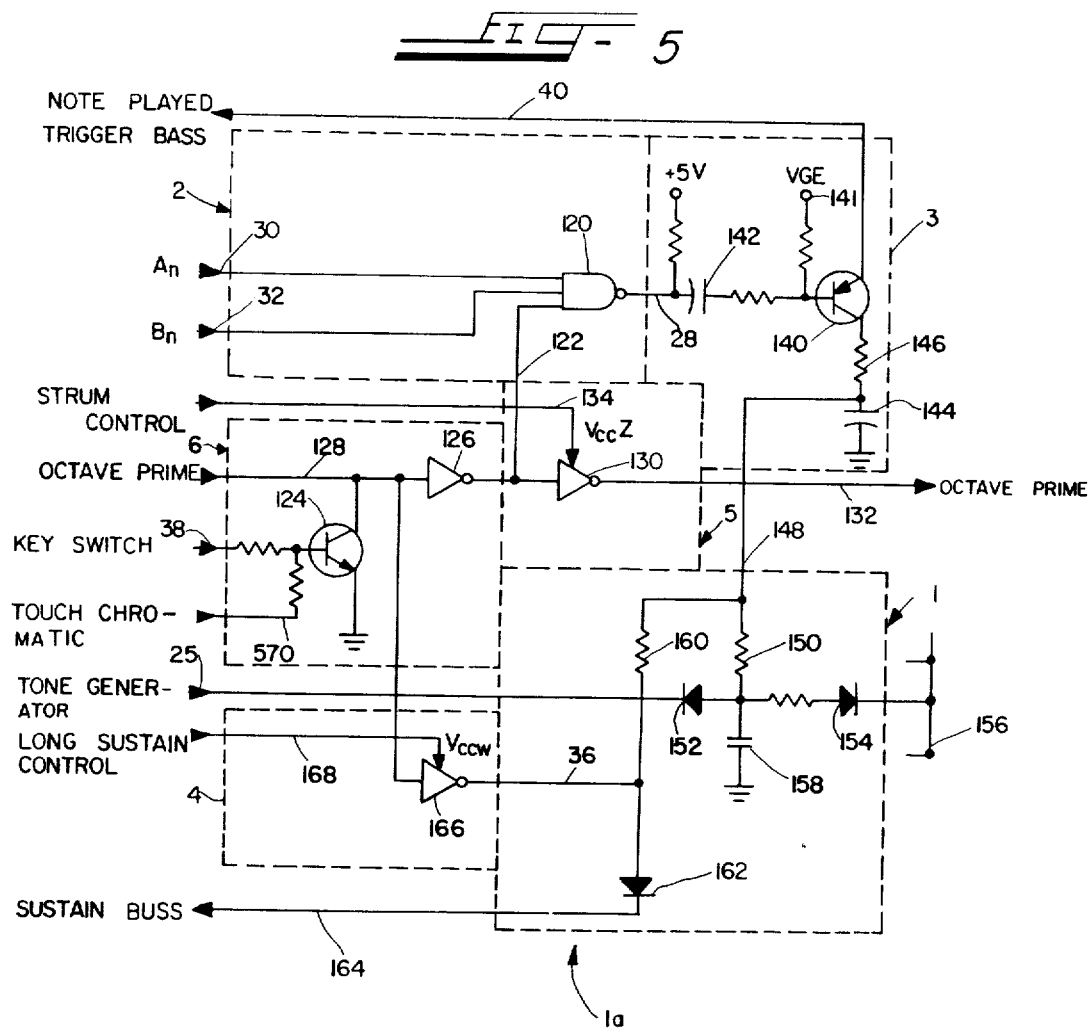

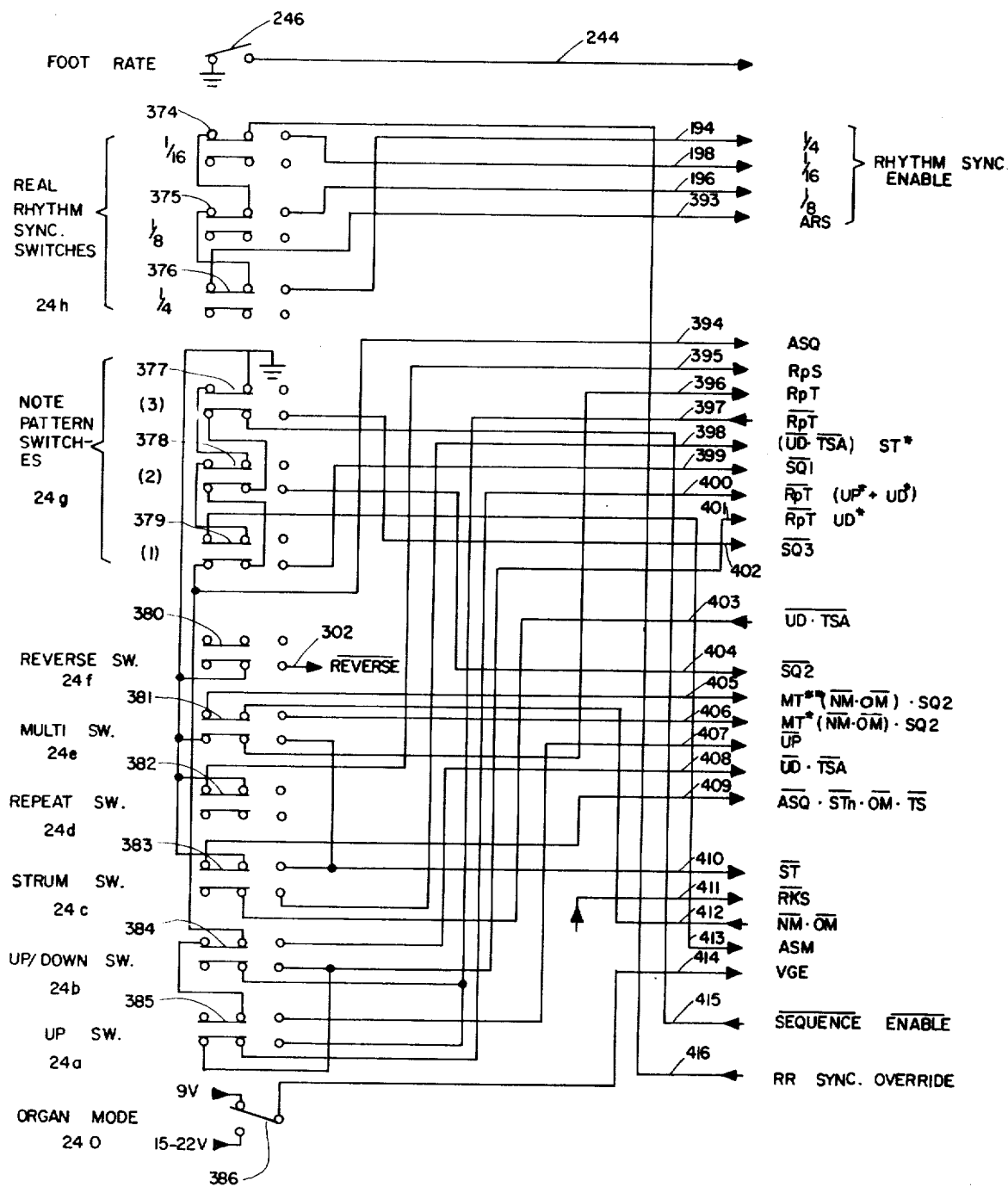

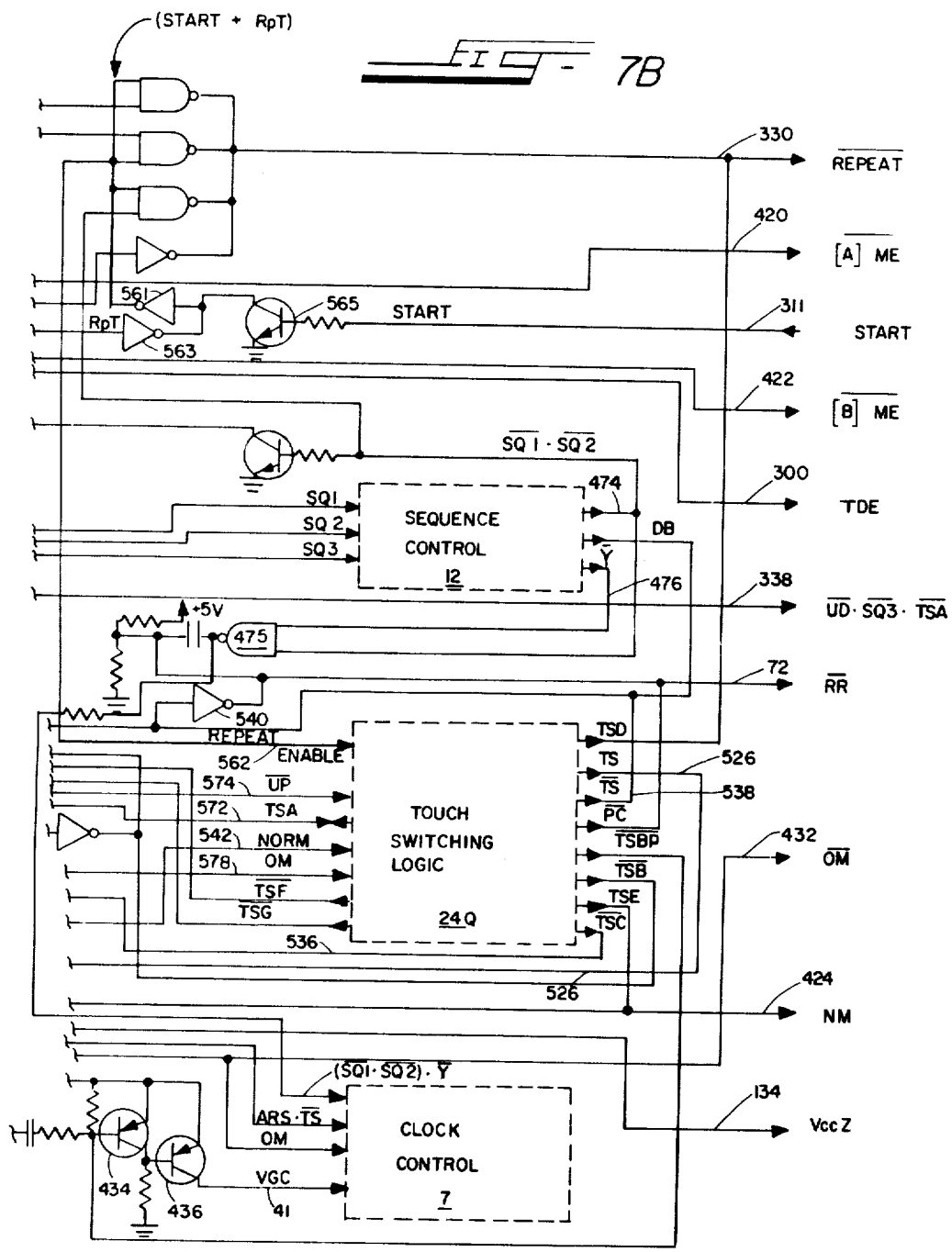

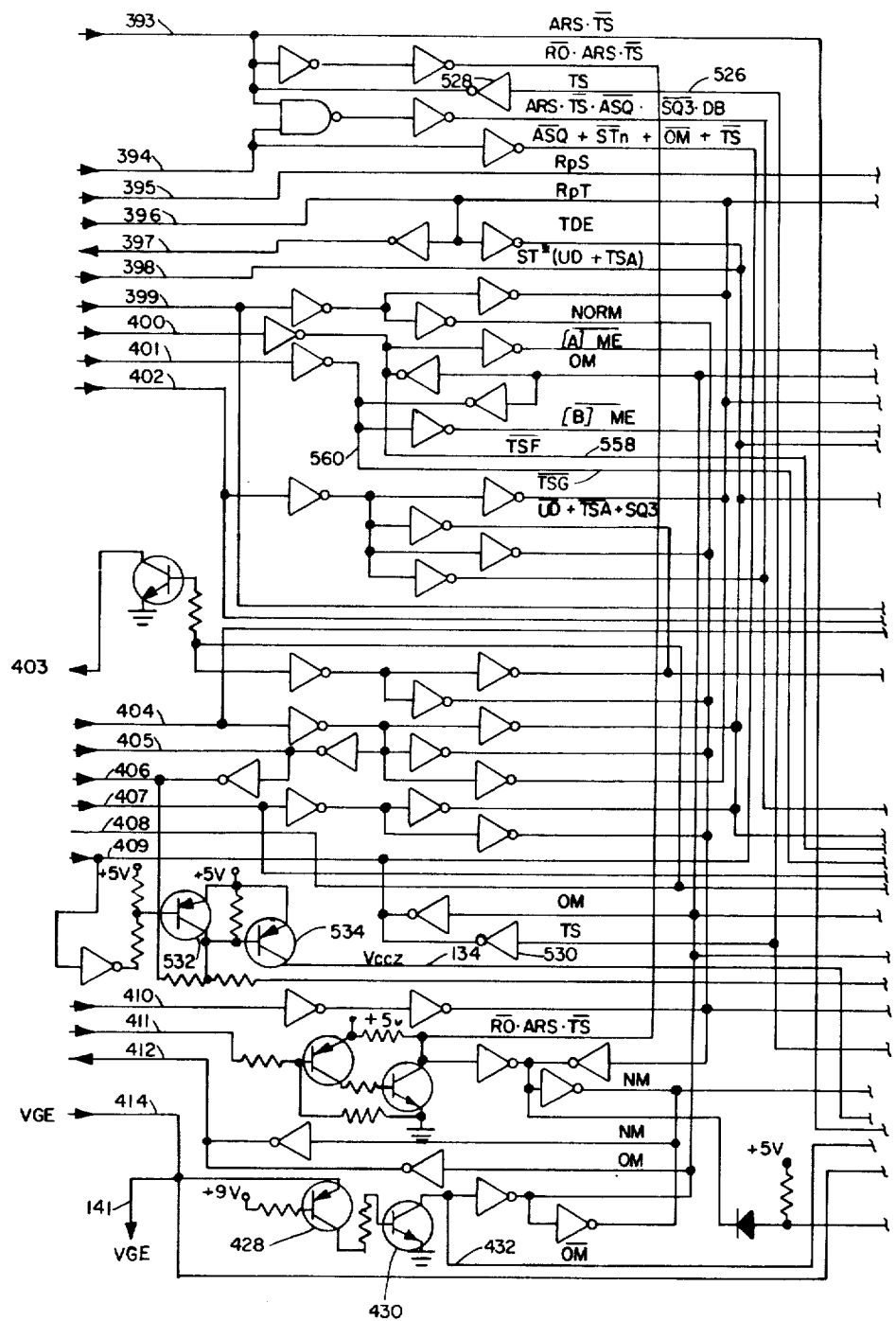

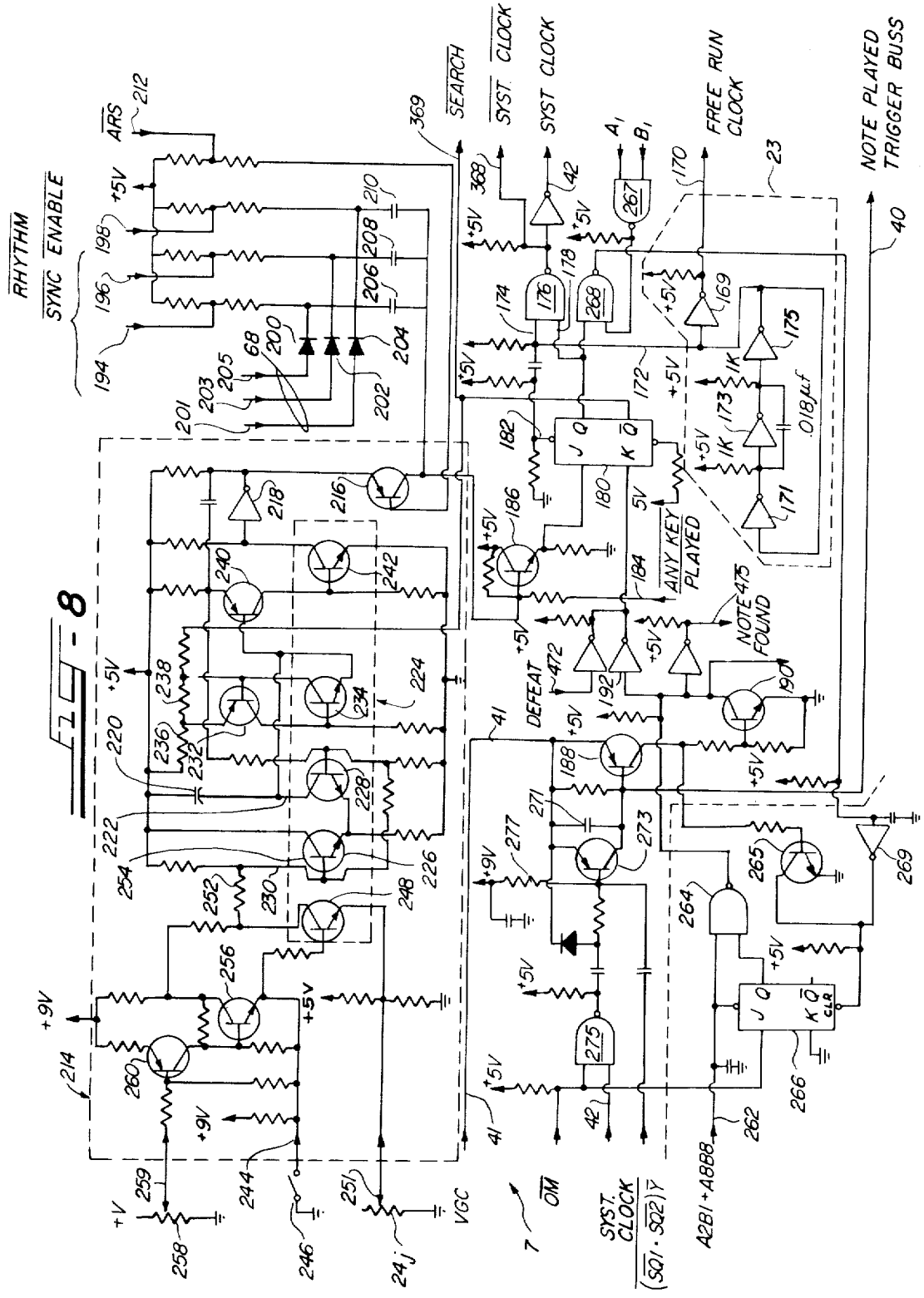

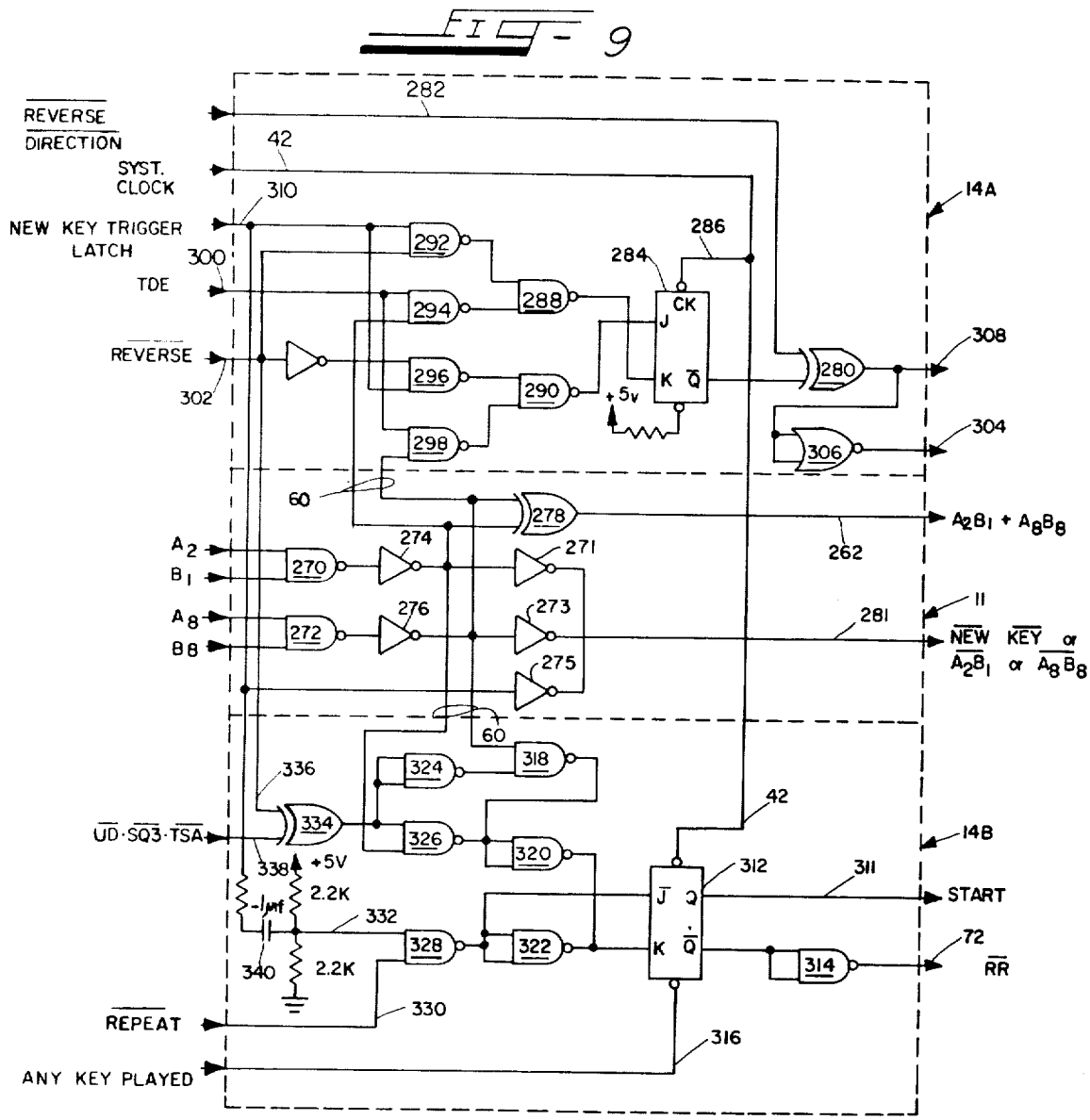

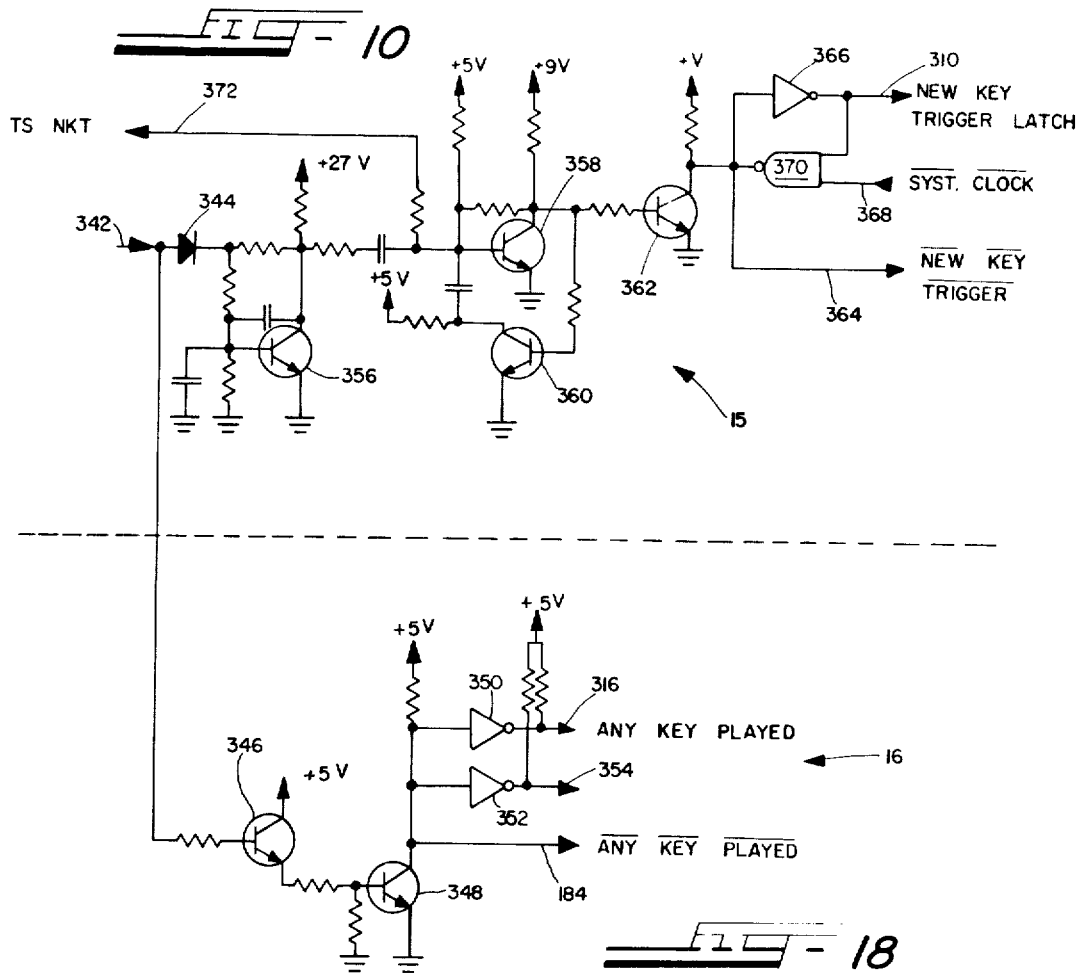

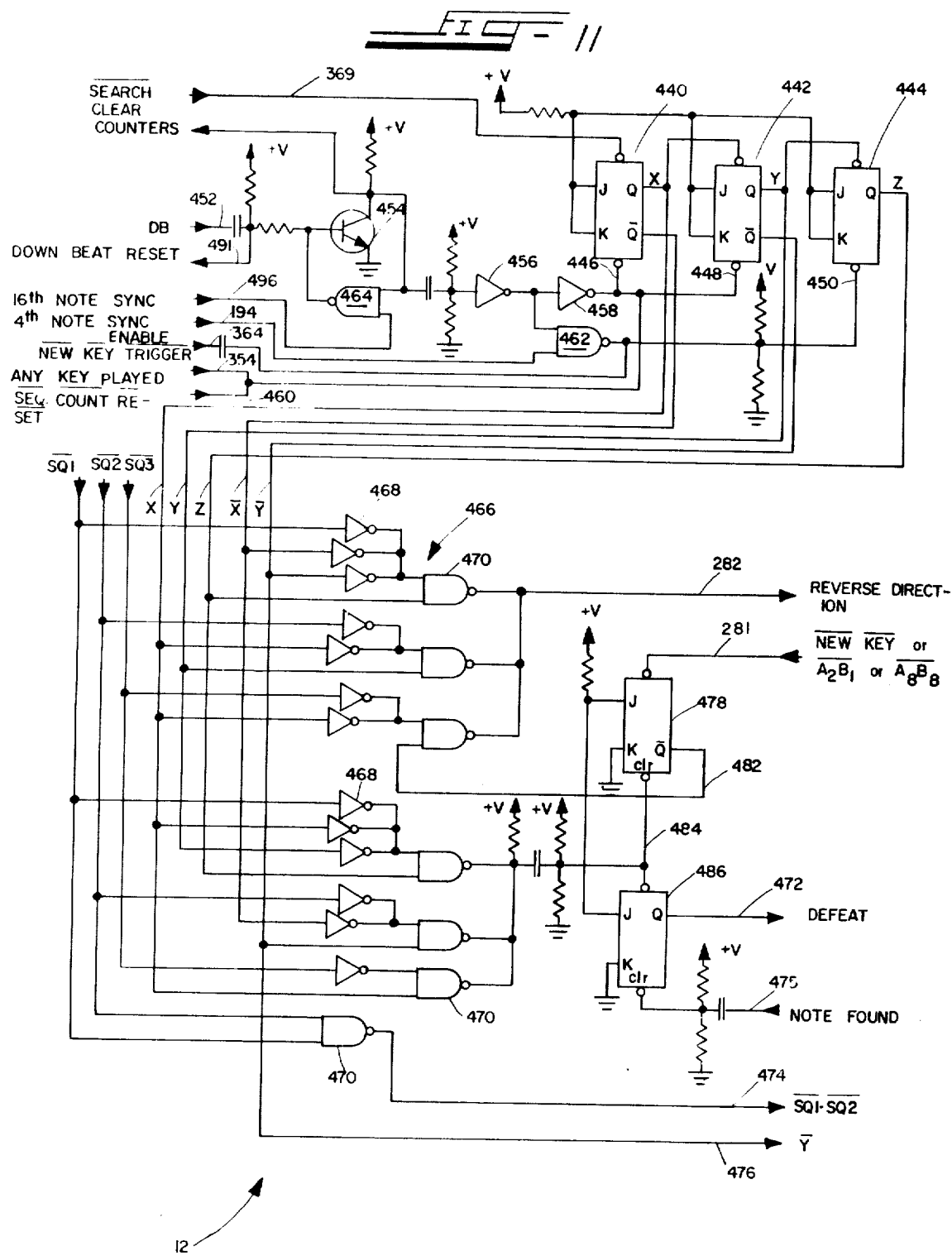

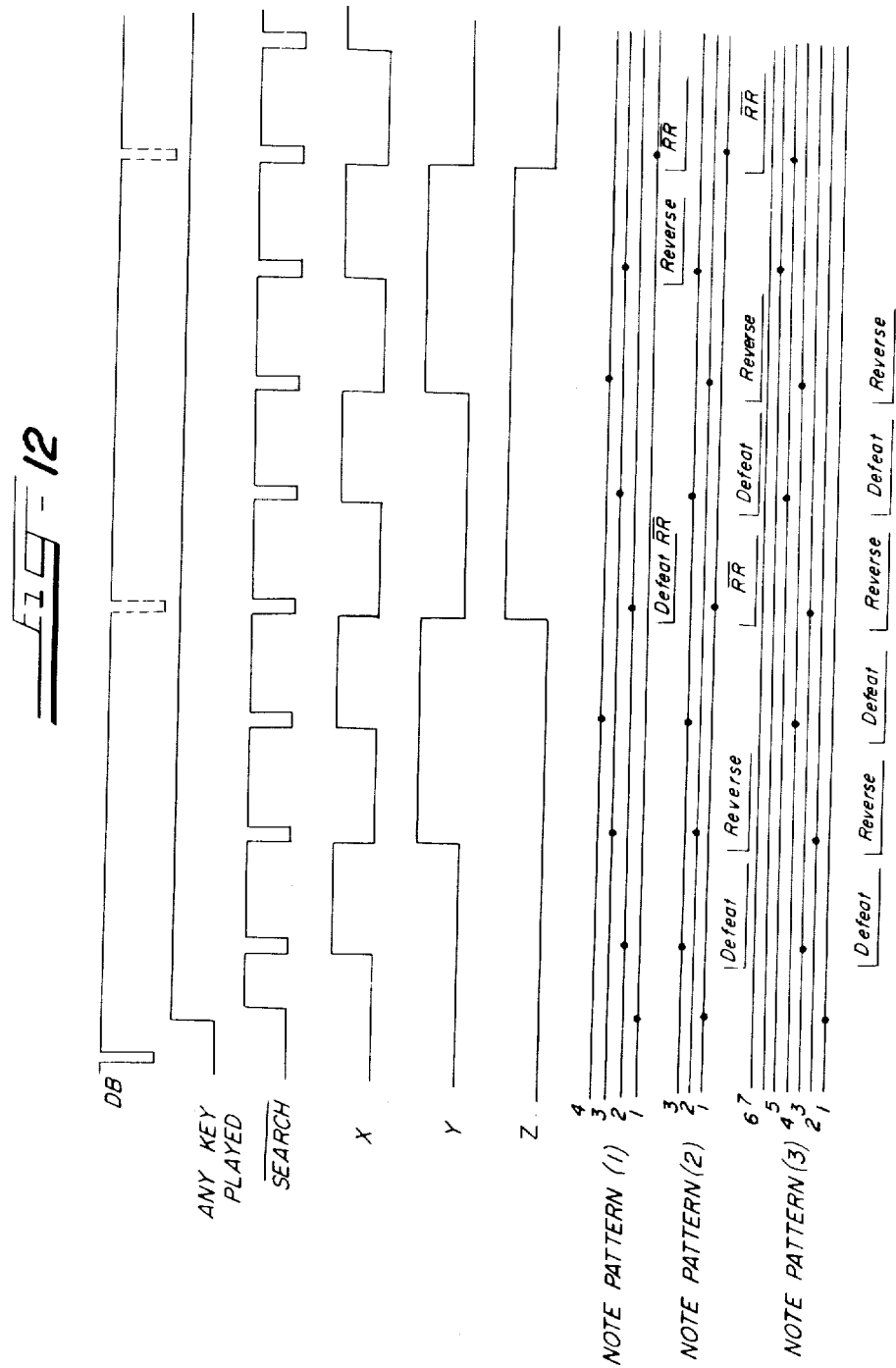

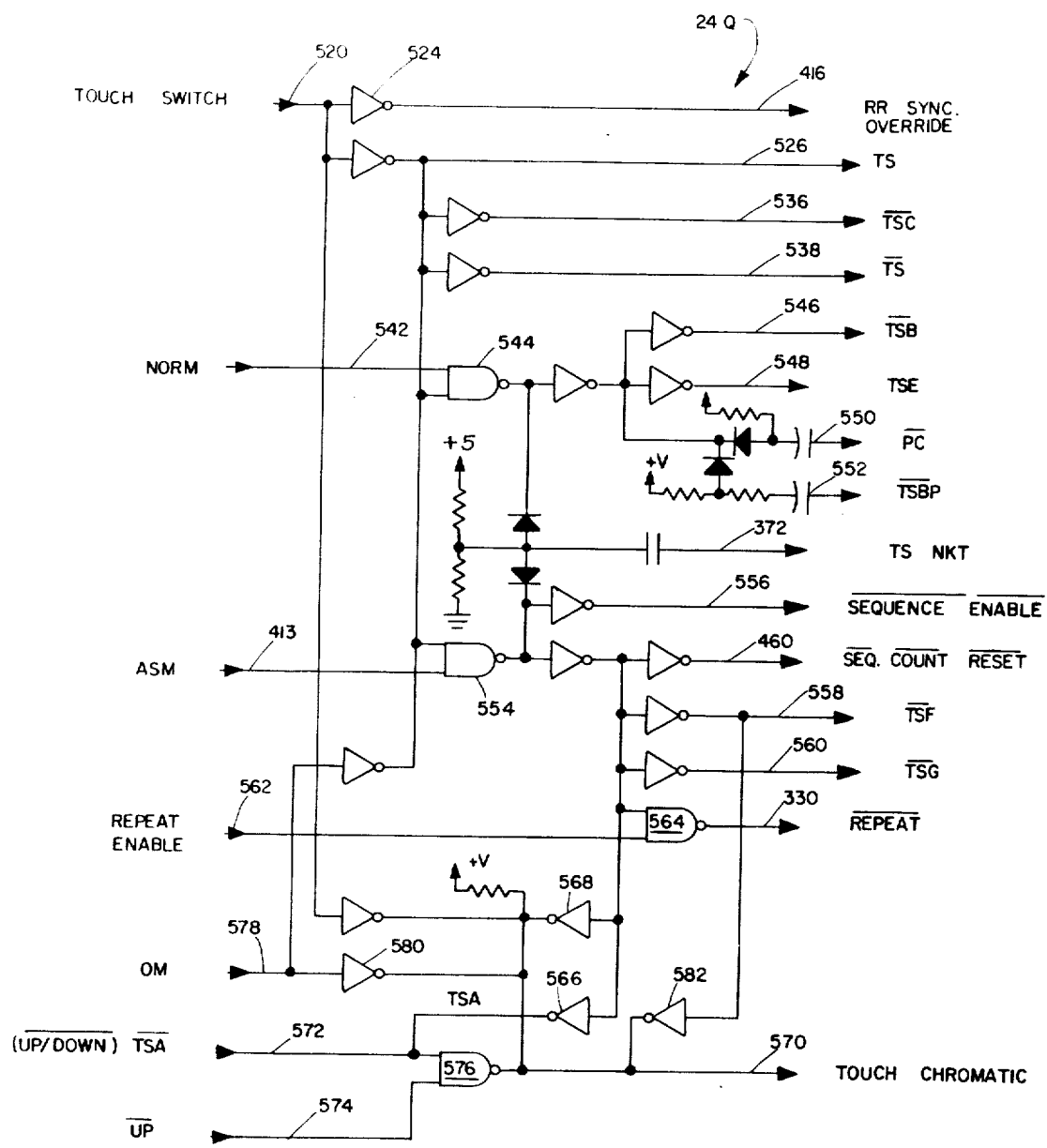

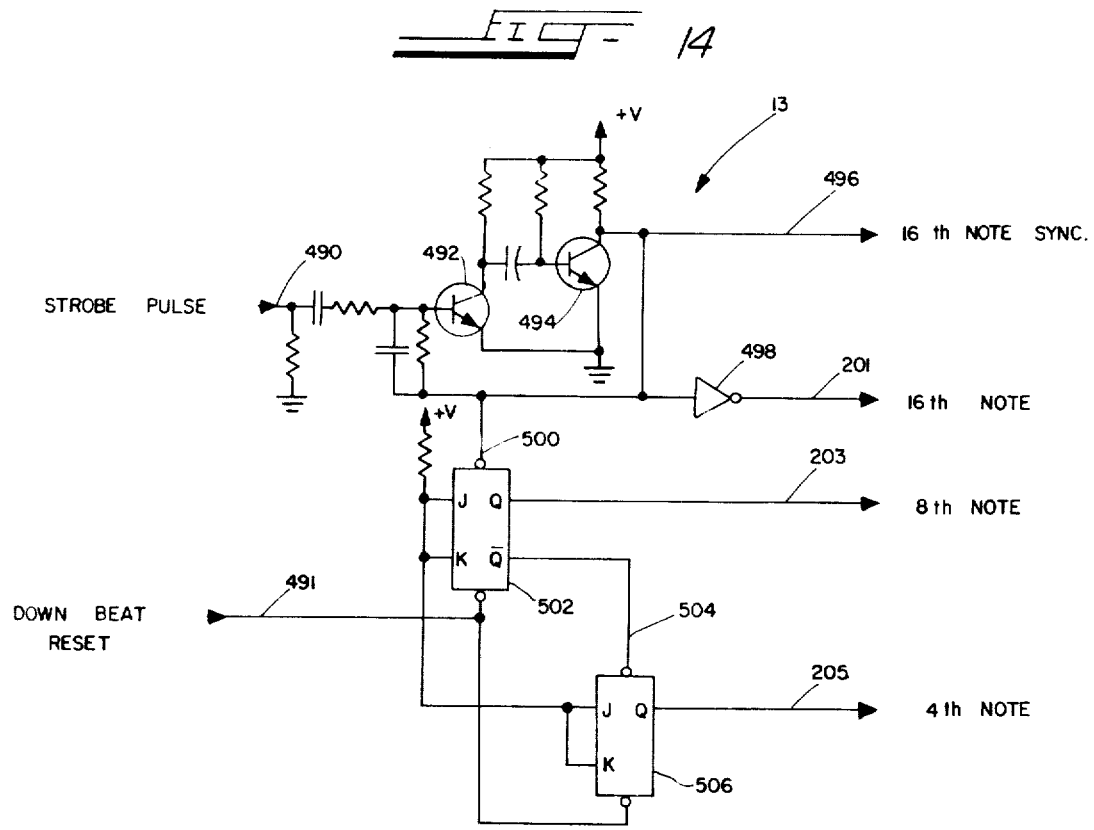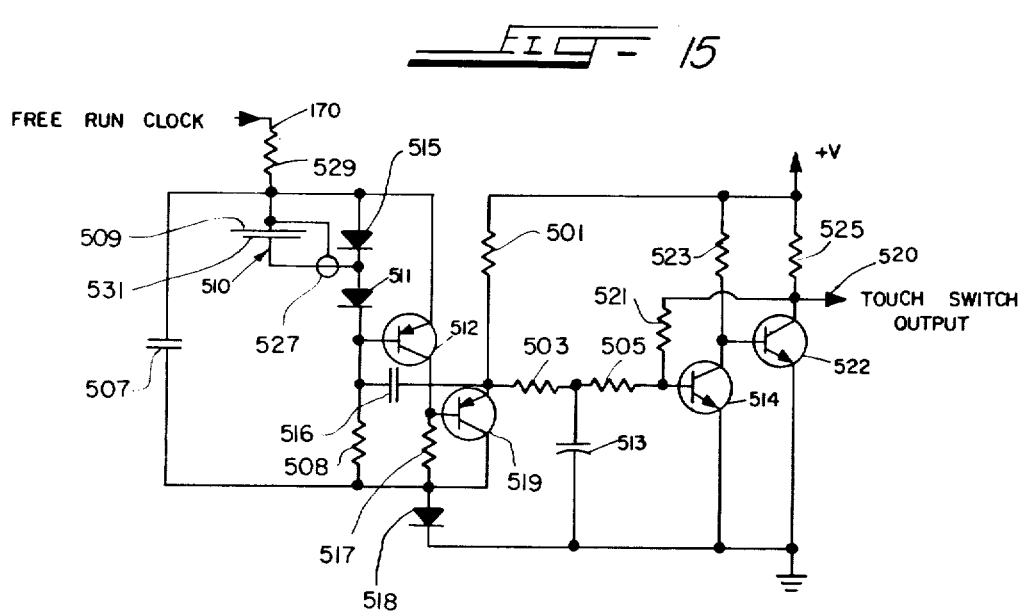

FIG-16

| INPUTS | | | | RING COUNTER OUTPUT | DECODER OUTPUTS | | | | | | | | CLOCK B |
|---|---|---|---|---|---|---|---|---|---|---|---|---|---|
| START STOP | UP(1) DN(0) | MULTI TONE | CLOCK | Qd Qc Qb Qa | A₁ | A₂ | A₃ | A₄ | A₅ | A₆ | A₇ | A₈ | |
| 0 | X | X | X | 0000 | 1 | 0 | 0 | 0 | 0 | 0 | 0 | 0 | |
| 1 | 1 | 0 | ↑ | 0001 | 0 | 1 | 0 | 0 | 0 | 0 | 0 | 0 | |
| 1 | 1 | 0 | ↑ | 0011 | 0 | 0 | 1 | 0 | 0 | 0 | 0 | 0 | |
| 1 | 1 | 0 | ↑ | 0111 | 0 | 0 | 0 | 1 | 0 | 0 | 0 | 0 | |
| 1 | 1 | 0 | ↑ | 1111 | 0 | 0 | 0 | 0 | 1 | 0 | 0 | 0 | |
| 1 | 1 | 0 | ↑ | 1110 | 0 | 0 | 0 | 0 | 0 | 1 | 0 | 0 | |
| 1 | 1 | 0 | ↑ | 1100 | 0 | 0 | 0 | 0 | 0 | 0 | 1 | 0 | |
| 1 | 1 | 0 | ↑ | 1000 | 0 | 0 | 0 | 0 | 0 | 0 | 0 | 1 | ↑ |
| 1 | 1 | 0 | ↑ | 0000 | 1 | 0 | 0 | 0 | 0 | 0 | 0 | 0 | |
| 1 | 0 | 0 | ↑ | 1000 | 0 | 0 | 0 | 0 | 0 | 0 | 0 | 1 | |
| 1 | 0 | 0 | ↑ | 1100 | 0 | 0 | 0 | 0 | 0 | 0 | 1 | 0 | |
| 1 | 0 | 0 | ↑ | 1110 | 0 | 0 | 0 | 0 | 0 | 1 | 0 | 0 | |
| 1 | 0 | 0 | ↑ | 1111 | 0 | 0 | 0 | 0 | 1 | 0 | 0 | 0 | |
| 1 | 0 | 0 | ↑ | 0111 | 0 | 0 | 0 | 1 | 0 | 0 | 0 | 0 | |
| 1 | 0 | 0 | ↑ | 0011 | 0 | 0 | 1 | 0 | 0 | 0 | 0 | 0 | |
| 1 | 0 | 0 | ↑ | 0001 | 0 | 1 | 0 | 0 | 0 | 0 | 0 | 0 | |
| 1 | 0 | 0 | ↑ | 0000 | 1 | 0 | 0 | 0 | 0 | 0 | 0 | 0 | ↑ |

FIG-17

| INPUTS | | | | RING COUNTER OUTPUT | DECODER OUTPUTS | | | | | | | | CLOCK B |
| --- | --- | --- | --- | --- | --- | --- | --- | --- | --- | --- | --- | --- | --- |
| START/STOP | UP(1)/DN(0) | MULTI TONE | CLOCK | Qd Qc Qb Qa | A1 | A2 | A3 | A4 | A5 | A6 | A7 | A8 | |
| 0 | X | X | X | 0000 | 1 | 0 | 0 | 0 | 0 | 0 | 0 | 0 | |
| 1 | 1 | 1 | ↑ | 0010 | 1 | 0 | 1 | 0 | 0 | 1 | 0 | 0 | |
| 1 | 1 | 1 | ↑ | 0101 | 0 | 1 | 0 | 1 | 0 | 0 | 1 | 0 | |
| 1 | 1 | 1 | ↑ | 1011 | 0 | 0 | 1 | 0 | 1 | 0 | 0 | 1 | ↑ |
| 1 | 1 | 1 | ↑ | 0110 | 1 | 0 | 0 | 1 | 0 | 1 | 0 | 0 | |
| 1 | 1 | 1 | ↑ | 1101 | 0 | 1 | 0 | 0 | 1 | 0 | 1 | 0 | |
| 1 | 1 | 1 | ↑ | 1010 | 0 | 0 | 1 | 0 | 0 | 1 | 0 | 1 | ↑ |
| 1 | 1 | 1 | ↑ | 0100 | 1 | 0 | 0 | 1 | 0 | 0 | 1 | 0 | |
| 1 | 1 | 1 | ↑ | 1001 | 0 | 1 | 0 | 0 | 1 | 0 | 0 | 1 | ↑ |
| 1 | 1 | 1 | ↑ | 0010 | 1 | 0 | 1 | 0 | 0 | 1 | 0 | 0 | |
| 1 | 0 | 1 | ↑ | 1001 | 0 | 1 | 0 | 0 | 1 | 0 | 0 | 1 | |
| 1 | 0 | 1 | ↑ | 0100 | 1 | 0 | 0 | 1 | 0 | 0 | 1 | 0 | ↑ |
| 1 | 0 | 1 | ↑ | 1010 | 0 | 0 | 1 | 0 | 0 | 1 | 0 | 1 | |
| 1 | 0 | 1 | ↑ | 1101 | 0 | 1 | 0 | 0 | 1 | 0 | 1 | 0 | |
| 1 | 0 | 1 | ↑ | 0110 | 1 | 0 | 0 | 1 | 0 | 1 | 0 | 0 | ↑ |
| 1 | 0 | 1 | ↑ | 1011 | 0 | 0 | 1 | 0 | 1 | 0 | 0 | 1 | |
| 1 | 0 | 1 | ↑ | 0101 | 0 | 1 | 0 | 1 | 0 | 0 | 1 | 0 | |
| 1 | 0 | 1 | ↑ | 0010 | 1 | 0 | 1 | 0 | 0 | 1 | 0 | 0 | ↑ |

IMPROVED TOUCH OPERATED CAPACITANCE SWITCH CIRCUIT FOR AN ELECTRONIC ORGAN

BACKGROUND OF THE INVENTION

1. Field of the Invention

The present invention relates to touch operated capacitance switches for electronic organs, and more particularly, to touch operated capacitance switches used in connection with arpeggio systems for electronic organs utilizing digital techniques to permit various modes of operation including arpeggios, strums, sequences, as well as normal modes of playing and the switching between the modes of operation by touch operation of the touch operated capacitance switch.

2. Description of the Prior Art

Automatic arpeggio systems for electronic organs are known in the art. For example, U.S. Pat. Nos. 3,718,748; 3,822,407; and 3,842,182 all in the name of Bunger, as well as U.S. Pat. No. 3,725,562—Munch, et al. disclose various types of systems for automatically producing arpeggio effects in an electronic organ. Similarly, U.S. Pat. No. 3,842,184—Kniepkamp, et al. discloses an electronic musical instrument having an automatic arpeggio system. While the various arpeggio systems disclosed by these prior art patents are quite suitable for their intended purpose, the present invention is an advancement over these prior art systems in that it utilizes digital logic techniques to achieve a wide variety of arpeggio sequences and modes of operation. Unlike prior art systems the present invention is not limited to an either an up or an up-down arpeggio mode and permits the playing of note sequences in other than ascending or descending chromatic order. Further, unlike the prior art systems the present invention is very flexible and has the ability to be rapidly changed between various modes of operation.

BRIEF DESCRIPTION OF THE INVENTION

The present invention comprises an improved touch operated capacitance switch used in conjunction with a system for sounding notes in a sequence in an electronic organ. The organ includes a set of tone signal generators, a set of key operated switches operated by the keys of the keyboard, an acoustic output system, a set of keying circuits connected between the output system and the respective ones of the tone generators. The improved touch operated capacitance switch in accordance with the present invention comprises a touch electrode, a guard electrode interposed between the touch electrode and nearest points of ground potential, a source of alternating voltage, and circuit means for applying the alternating voltage to the guard electrode and the touch electrode. The guard electrode cooperates with the alternating voltage to reduce the capacitance of the touch electrode to ground. The circuit means further comprises means to detect increased current flow to the touch electrode when the touch electrode is touched by human extremity, and an output terminal connected to the means to detect. The output terminal is caused to have a voltage potential at a first state by the detector means when the touch electrode is not touched, and caused to have a voltage potential of the second state by the detector means when the touch electrode is touched.

The output terminal of the touch switch may be connected to an arpeggio system in an electronic organ having a plural modes of operation so that when the voltage potential of the output terminal goes from the first state to the second state when the touch electrode is touched, the mode of operation of the electronic musical instrument is changed. The arpeggio system in connection with which the present invention may be used may include counter means for producing in sequential order in response to operation of one or more of the key operated switches a set of two-component pairs of logic signals, each pair of logic signals corresponding to a different one of tone generators. Decoder means are provided for receiving and decoding the pairs of logic signals and causing the keying circuits to transmit a corresponding tone signal to the output system as a corresponding pair of logic signals is received for each tone generator for which a corresponding key switch has been actuated. Also provided are control means for stopping the counter means for a predetermined time each time a tone signal is transmitted to the output system so that an equal time interval sequence of notes is played.

The arpeggio system in connection with which the present invention may be used also comprises means for enabling the keying circuits for tone signals octavely related to the actuated keys to transmit tone signals to the output system in response to receipt of a pair of logic signals corresponding to the octavely related tone signals such that the arpeggio sequence is sounded through all of the octaves of the keyboard. The arpeggio system further comprises means for causing the counter means to produce logic signals in a manner such that the tone signals are transmitted and sounded in an up arpeggio. Also, means may be provided for causing the tone signals to be transmitted and sounded in an up/down arpeggio as well.

The counter means can be controlled in such a way as to produce logic signals in a manner such that the tone signals are transmitted and sounded in a preselected pattern of notes. The system can also include means for causing the counter means to produce all of the logic signals simultaneously so that the tone signals are sounded as the key operated switches are actuated thereby simulating the normal mode of operation of the organ. The arpeggio system may also comprise means for causing the tone signals to be sounded in accordance with a preselected rhythm provided by a rhythm unit. In addition, arpeggio system can further comprise means for causing the counter means to produce in sequential order multiple subsets of pairs of logic signals, the multiple subsets of pairs of logic signals corresponding to octavely related tone signals so that when the sequence of notes is sounded, multiple octavely related notes are sounded simultaneously to produce a fuller, richer sound. The present invention comprises a touch operated capacitance switch used to automatically change the selected mode of operation upon operator contact with the touch operated capacitance switch so that modes of operation can be changed quickly during the course of playing of a musical composition.

The present invention can also be used in connected with an arpeggio system comprising means for sounding the tone signals percussively at selectable rates of decay as well as comprising damper means for rapidly terminating the sounding of the tone signals upon release of the key operated switches to simulate the damping action of a piano. Further, means may be provided for adjusting the predetermined time the control means stops the counter means each time a signal is transmitted so that the interval between the sounding of notes can be adjusted.

Thus, it is a principal object of the present invention to provide an improved touch operated capacitance switch which may be used to quickly switch between modes of operation in a digital arpeggio system for an electronic organ which through digital logic techniques permits a wide variety of modes of operation including up arpeggio mode, up/down arpeggio mode, down arpeggio mode, strum mode, normal mode, three different note patterns, as well as four mode modifications including continuous mode, multi-tone mode, reverse mode, and touch strip mode.

These and other objects, advantages, and features shall hereinafter appear, and for the purposes of illustration, but not for limitation, an exemplary embodiment of the present invention is illustrated in the accompanying drawings.

BRIEF DESCRIPTION OF THE DRAWINGS

FIG. 1 is a block diagram of a preferred embodiment of the present invention.

FIG. 2 is a detailed circuit diagram of the matrix counters of the preferred embodiment of the present invention.

FIG. 3 is a diagram of the 8×8—64 word logic matrix produced by the counters of FIG. 2.

FIG. 4 is a diagram of the wave form of the system clock of the preferred embodiment.

FIG. 5 is a circuit diagram of the decoder, pulser octave prime, damper and keyer circuits of the preferred embodiment of the present invention.

FIG. 6 is a circuit diagram of the mode switch wiring of the preferred embodiment of the present invention.

FIG. 7 is a block diagram showing the alignment of FIGS. 7-A and 7-B. FIGS. 7-A and 7-B are detailed circuit diagrams of the switch logic interface circuits of the preferred embodiment of the present invention.

FIG. 8 is a circuit diagram of the clock control circuit of the preferred embodiment of the present invention.

FIG. 9 is a circuit diagram of the counter control circuit of the preferred embodiment of the present invention.

FIG. 10 is a circuit diagram of the new key played and any new key played detector circuits of the preferred embodiment of the present invention.

FIG. 11 is a circuit diagram of the sequence control circuit of the preferred embodiment of the present invention.

FIG. 12 is a diagram of the sequence control wave forms produced by the sequence control illustrated in FIG. 11 and the resultant note patterns.

FIG. 13 is a circuit diagram of the touch switch logic circuit of the preferred embodiment of the present invention.

FIG. 14 is a circuit diagram of the rhythm divider circuit of the preferred embodiment of the present invention.

FIG. 15 is a circuit diagram of the touch switch circuit of the preferred embodiment of the present invention.

FIG. 16 is a truth table for the counter circuits illustrated in FIG. 2 during the arpeggio mode of operation.

FIG. 17 is the truth table for the counter circuits illustrated in FIG. 2 during the multi-tone mode of operation.

FIG. 18 is a chart showing the matrix addresses and notes sounded during multi-tone mode of operation.

DETAILED DESCRIPTION OF THE PREFERRED EMBODIMENT

With respect to FIG. 1, sixty-one identical keyer arrangements 1-*a* through 1-*iii* are illustrated (only arrangements 1-*a*, 1-*b*, and 1-*iii*, being illustrated). Each keyer arrangement comprises a keyer circuit 1, a decoder circuit 2, a pulser circuit 3, a damper control circuit 4, an octave prime control circuit 5, and an octave coupler circuit 6. Each of the keyers 1 of each of the sixty-one keying arrangements 1-*a* through 1-*iii* is connected by one of sixty-one leads 25 to a corresponding one of sixty-one tone generators 19 (for convenience shown as a box) which provide tone signals corresponding to the sixty-one notes of the organ. Each of the keyer circuits 1 is also connected by a lead 148 to a corresponding pulser circuit 3 in each of the keyer arrangements 1-*a* through 1-*iii*. The pulser circuit 3 in turn is connected to the decoder circuit 2 by lead 28. Decoder 2 receives logic matrix information from counter 8 on leads 30, and from counter 9 on leads 32. Decoder 2 also receives logic information from the octave prime coupler circuit 6 on lead 122. Decoder circuit 2 decodes the information received on leads 30, 32 and 122 to provide an appropriate signal on lead 28 to pulser circuit 3 to control the operation of keyer circuit 1 at appropriate times as will be more fully described hereinafter. Damper control circuit 4 is connected to keyer circuit 1 by lead 36 and operates to cause the output of keyer circuit 1 to decay rapidly when a corresponding key switch 17 is released to simulate the damper action of a piano. When long sustain is selected, the action of damper control circuit 4 is eliminated. Sixty-one key operated key switches 17 for the sixty-one notes of an organ are connected by sixty-one leads 38 to a corresponding octave prime coupler circuit 6. As will be more fully explained below, octave prime coupler circuit 6 detects either the actuation of a corresponding key switch 17 or an enabling signal from an octave prime control circuit 5 of the next lowest octave and transfers the enabling signal to decoder circuit 2, and damper control circuit 4.

Octave prime control circuit 5 automatically transfers an enabling signal of the octave prime coupler circuit 6 to the appropriate octave prime coupler of the next highest octave keyer arrangement unless the octave prime control circuit 5 is disabled. Pulser circuit 3 provides an enabling signal on lead 148 which turns on the keyer 1 at appropriate times and also generates note played information which is conveyed on note played trigger bus 40 to the clock control circuit 7. Pulser circuit 3 provides an enabling signal to keyer circuit 1 of a duration of approximately 12 milliseconds. This is a sufficiently long signal for percussive keying of the tone signals from the tone generators 19. Pulser circuit 3 will ignore new enabling signals from decoder circuit 2 for approximately 7 milliseconds following the first enabling signal. In an up-down arpeggio mode, for example, this inhibits double sounding of the last note sounded during the up arpeggio sequence which becomes the first note addressed on down sequence.

Clock control circuit 7 controls the application of high frequency clock pulses from free running clock 23 at regular time intervals during the search and hold status of the counters 8 and 9. Note played information is supplied to the clock control circuit 7 on lead 40 when a played note is found and the transmission of high frequency clock pulses is then stopped for a period of time determined by a rate control while the note is sounded. After a period of time, the high frequency clock pulses are again transmitted to the counters 8 and 9 as will be more fully described below so that subsequent notes can be found and played. Rate control can be accomplished by a timing network within the clock control 7, and can be varied by a rate potentiometer 24j. Rate control can also be accomplished by rhythm divider circuit 13 so that notes are sounded in synchronization with the rhythm unit 20. The clock control circuit 7 provides system clock information on lead 42 to both counter 8 and to counter control circuit 14. New key detector circuit 15 also receives inverted system clock control information on lead 368 from clock control circuit 7 so that new key information will be held and made available to the system even though a new key is actuated while the system clock is disabled by the clock control circuit 7 while a note is being played.

The clock control circuit 7 also supplies signals on lead 369 to the sequence control circuit 12 relating to the search and hold state which is used to determine the note played information and note skipped information for the various note sequences. These signals and the sequence control circuit 12 will be explained in more detail hereinafter. The clock control circuit 7 can also be programmed by the actuation of the organ mode switch to ignore note played detection signals. In this mode of operation, the system clock output on lead 42 continuously transmits clock pulses from free-running clock 23 so that decoder circuit 2 will repeatedly enable keyers 1 to key tone signals for short periods of time as will be more fully discussed later.

Counters 8 and 9 count to develop a matrix of sixty-four logic word signals from A1–B1 to A8–B8 as illustrated in FIG. 3. In other words, counter 8 counts from A1 to A8 while counter 9 has a B1 output. Counter 9 then counts to B2 and counter 8 once again counts from A1 through A8. This counting continues until the A8–B8 end point is reached. If an up-down arpeggio mode is selected, the counters 8 and 9 reverse and count back down from A8–B8 to A1–B1.

Counter 8 has eight output leads 48, one for each of logic words A1 to A8. Similarly, counter 9 has eight output leads 50, one for each of logic words B1 to B8. Leads 48–50 are connected to decoder circuits 2 in keying arrangements 1-a through 1-iii in such a manner that only one decoder 2 receives an An-Bn logic signal corresponding to the note of its corresponding keyer 1. For example, with reference to FIG. 3, assuming keyer 1 is connected to the tone generator for the note A2, its corresponding decoder 2 would be connected in such a way as to receive the logic signal A4–B2 from counters 8 and 9. Keyer 1 would then be enabled to transmit the audio signal from the corresponding tone generator 19 to the acoustic output system comprising tone color circuit 21, amplifier 22 and loudspeaker 56 only when the A4–B2 logic signal is received and a corresponding key switch 17 is closed. Counters 8 and 9 are identical except counter 8 receives system clock information from the clock control circuit 7 on lead 42 whereas counter 9 receives its clock information on lead 102 from counter 8 when the A-8 end point is reached.

Multi-tone injection circuit 10 alters the normal bit content for each word in one or both of the counters 8 and 9. This permits octavely-related notes to be sounded simultaneously in all octaves to give fuller, richer sound, as will be more fully described hereinafter.

Matrix end address decoder circuit 11 detects the address end points A2–B1 and A8–B8 and provides enabling information on two leads 60 to the up-down function control circuit 14A and the start-stop function control circuit 14B in counter control circuit 14 to cause counters 8 and 9 to reverse directions at the end of the count if an up-down arpeggio is desired or to stop the counters at the end of the count if only an up arpeggio is desired.

Sequence control circuit 12 supplies system command signals to clock control 7 on lead 472 depending upon the sequence selected by the note pattern select switches 24G. These signals from the sequence control circuit 12 applied to clock control 7 causes notes to be passed over without sounding as required by the selected sequence pattern. An output signal supplied on lead 72 to counters 8 and 9 causes pattern repetition by resetting the counters 8 and 9. A signal supplied on lead 282 to counter control circuit 14 regulates the up-down function according to the selected sequence. The sequence control circuit 12 is enabled by any key played detector circuit 16, and timing is determined by the clock control circuit 7. When in rhythm sync, the sequence control circuit 12 is synchronized with down beat information from the rhythm unit 20. Rhythm divider 13 generates three outputs on three leads 68 each of which is a function of the rhythm unit timing. The three outputs are applied to clock control 7. The rhythm divider outputs are synchronized with a strobe pulse from the rhythm unit 20.

Counter control circuit 14 includes up-down function control circuit 14A and start-stop function control circuit 14B. Start-stop function control circuit 14B resets or enables the counters 8 and 9. The enabling of counters 8 and 9 can only occur upon the detection of a key played by new key detector circuit 15. Operator arpeggio programming (up, up-down or reverse arpeggios) or note pattern programming of the counter control 14 produce logic information which is combined with information from the matrix end point address decoder 11 to stop and reset counters 8 and 9 at appropriate times. The new key detector circuit 15 disables a matrix end point reset condition if the end point is encountered immediately following the playing of a new key. Also, if continuous playing is desired, an appropriate switch may be actuated to disable the reset programming. The exact circuitry to perform these functions will be described below.

The up-down function control circuit 14A controls the direction of successive word changes of the counters 8 and 9. The operator can select either an up, up-down, or a reverse arpeggio by the arpeggio select switches 24B and reverse switch 25F or an appropriate note pattern by the note pattern select switches 24G and the direction of the matrix scan is modified by signals from the end address decoder circuit 11, from the new key detector circuit 15, or from the sequence control circuit 12.

The new key detector 15 detects when the first of any of the key switches 17 is closed or when an additional key is added to the keys already played. The new key detector 15 enables program data transfer to the counter control circuit 14 as will be more fully described below. If the new key is detected while there are no system clock pulses on lead 42, the new note information is retained until the clock control recommences transmission of the clock pulses on lead 42.

Any key played detector circuit 16 provides enabling signals to counter control circuit 14, rhythm divider circuit 13, and sequence control circuit 12 whenever any key switch 17 is closed for the purposes that will be described below.

The blocks designated 24 represent the electrical interface between the various mode control switches which are operated by the player and the logic system. The logic system receives command information from the interface 24 via the various control lines extending from the bottom of block 24. These control lines are shown as originating from a particular section 24A through 24Q of interface 24. For example, section 24B (arpeggios) shows control lines which go to the counter control 14. When a particular arpeggio switch is closed by the player, e.g. up/down arpeggio, the counter control 14 is programmed and the expected arpeggio will result when the keys are played.

Sections 24 a, b, c, d, e, g, h, o, and q are interconnected electrically such that the multiple switching of contradictory player commands (such as up arpeggio and note pattern (1)) will result in a priority mode of operation. Section 24q represents circuitry which is activated by a capacitance-sensitive touch switch. Section 24q detects the mode of operation programmed by the player by monitoring mode sections such as 24a (normal), 24b (arpeggio), 24c (strum), and 24g (patterns). When the touch switch is activated, the touch switch circuitry 24q operates on the control line information such that a new mode of operation takes effect as long as the organist maintains physical contact with the touch switch. The exact function of touch switch circuitry 24q will be described in more detail later. Section 24i is a volume potentiometer that controls amplifier 22. Section 24c supplies control voltage on lead 134 to octave prime control 5.

Various modes of operation are possible with the present invention. The normal mode of operation permits notes to be sounded as the key switches 17 are operated. In this mode, all 8 outputs of each of the counters 8 and 9 are forced to a high state such that all 61 decoder circuits 2 transfer an enable signal to the respective keyer circuits 1. Any keyer 1 is now enabled to couple the respective tone generator 19 to the tone color circuit 21 and amplifier 22 when enabled through the damper control 4 by the operation of a corresponding key switch 17. Either regular or long sustain may be selected and octave coupling remains optional in the normal mode.

In the up arpeggio mode, the up-down function control 14A of the counter control 14 causes the counters 8 and 9 to count in the A B word seccession in the up direction and then to reset at the high end (A8–B8) in response to the control signal from the start-stop function control circuit 14B. This permits sounding of an up arpeggio only.

When an up-down arpeggio mode is selected, counters 8 and 9 count up in succession to the high matrix in point (A8–B8) and the counting is reversed so that counters 8 and 9 count back down to the low matrix in point (A2–B1) and the counters are stopped. This permits sounding of an up-down arpeggio.

In the strum mode of operation, the octave prime control 5 is inhibited so that only the notes played are sounded. The counter control 14 directs the counters 8 and 9 to count upward and reset at the high matrix in point. Thus, a guitar strum is simulated.

Three different sequences of notes may also be selected. By selecting a particular sequence, the order in which the notes are played during an arpeggio sequence can be varied. For example, if the notes C, E and G are played, note pattern 2 plays the notes in the order C, G, E, G rather than in the regular chromatic order of C, E, G. By selecting the desired sequence, the sequence control unit 12 programs the counter control 14 in such a manner so as to alter the word succession of the counters 8 and 9 causing notes to be skipped as required by the note sequence.

In the multi or multiple tone mode of operation, the counters are enabled to produce sub-sets of An Bn words simultaneously for octavely related notes so that octavely related notes (e.g., C2, C3, C4) are sounded simultaneously for a richer, fuller sound. As an example, see FIG. 18.

In the organ mode, the notes are sounded non-percussively. When a key switch is closed, the note sounds with slow attack and continues to sound as long as the keyswitch is closed.

In order to explain the operation of the detailed circuit diagrams of the present invention, circuits directly related to the generation of an arpeggio will first be discussed. The arpeggio mode is the most basic mode of operation of the present invention, and all other modes (normal, organ, strum, multi and note patterns) are variations of the basic arpeggio.

It is essential to the operation of the present invention that specific notes be uniquely enabled to be sounded at predetermined times. Further it is essential that the logic controls (such as start-stop, direction, timing) generate an expected sequence of events. For example, in the up arpeggio mode, the lowest note played must be the first to be sounded; and then at the rate programmed by the operator, each of the other notes which are octavely primed must sound in low to high succession. After the highest note has sounded, the circuit must not enable another note to sound until new information is received from the operator by operation of the key switches 17.

COUNTER CIRCUITS

With reference to FIG. 2, the detailed circuit diagram of counters 8 and 9 is illustrated. Integrated circuit 70 is a 4-bit shift register commercially available under the number designation 74195. The shift register 70 is held in the clear state by a logic zero on input lead 72 to CLR input of shift register 70, and the four outputs QA, QB, QC, and QD are held at logic zero independent of all other control information as long as there is a logic zero on lead 72. When the shift register 70 is not held in the clear state, information can be transferred from one Q output to the next Q output upon each low to high clock transition on system clock (CK) input on lead 42 from the clock control 7. The shift register 70 is wired for ring counter bi-directional operation. The shift/load (S/$\overline{\text{L}}$) input on lead 74 controls serial/parallel operation of the shift register 70. When shift/load (S/$\overline{\text{L}}$) lead 74 is at logic one, the operation is serial and the logic one information is inputted through the J and $\overline{\text{K}}$ leads 76 and 77. Serial operation is the up arpeggio mode of operation. The J and $\overline{\text{K}}$ leads 76 and 77 receive the inverted QD output of shift register 70 via inverting transistor 78. In this way, the Johnson code is circulated through the shift register. FIG. 16 shows the ring counter truth table.

When the S/$\overline{L}$ lead 74 is at logic zero, the shift register operates in the parallel input mode such that the Johnson code is circulated in the reverse direction compared to the serial operation. Therefore, the S/$\overline{L}$ lead 74 controls the shift register 70 to control the direction of the ring counter operation. The two-level gating system comprising nor-gates 80–89 and inverters 91–93 convert the QA, QB, QC, QD outputs of the shift register 70 to a new code on outputs A1–A8. FIG. 16 illustrates the respective logic outputs on each of outputs A1–A8 for each of the Johnson code outputs on QA–QD. Thus, it can be seen there is a logic 1 output on leads A1–A8 only for a corresponding one of the eight possible Johnson code states.

Counter 9 is substantially identical to counter 8. Counter 9 comprises a 4-bit shift register integrated circuit 100 and lead 74 is also connected to the S/$\overline{L}$ input of shift register 100 to control serial and parallel operation in the same manner as shift register 70. The principle difference between the circuits resides in the fact that the clock (CK) input for shift register 100 is on lead 102 from OR gate 101, and NOR gates 103 and 99 which operate to decode the transition from A8 to A1 (up) or from A1 to A8 (down) so that shift register 100 is clocked after each complete scan of the counter 8 output. Thus, as indicated in FIG. 16, under the column "clock B" at each end point transition, there is a low to high clock transition which is applied on lead 102 to shift register 100. In this manner, the QA–QD outputs of shift register 100 produce a Johnson code output which is applied to the two-level gating system comprising NOR gates 104–113 and inverters 114–117 to produce logic signal outputs on B1–B8 in sequential order for each of the complete sequence of logic signals on outputs A1–A8. In this manner, an 8×8 matrix of two component pairs of logic signals is formed which allows time sequential increments through 64 different positions or words. Thus, the (A) (B) counter outputs provide an address code matrix of logic signals as illustrated in FIG. 3. The multi-tone injection circuit 10 shown in FIG. 2 will be discussed later. For arpeggios, the multi-tone outputs have no effect.

KEYER ARRANGEMENTS

With reference to FIG. 5, one of the sixty-one keying arrangements, such as keying arrangements 1-*a* through 1-*iii*, is illustrated. There is one such keying arrangement available for each of the 61 tone generators of the organ. Decoder 2 comprises a 3-input NAND gate 120 which requires three logic one inputs for a logic zero output. Two of the inputs are designated An and Bn and correspond to a set of the outputs 30 and 32 from the counters 8 and 9 corresponding to the particular note for the keyer arrangement. For example, with reference to FIG. 3, if the particular keyer arrangement corresponds to the note C2, the inputs to the NAND gate 120 would be A3–B1, and the corresponding C2 tone signal generator would be connected to line 25 to the input of keyer circuit 1. The third input to the NAND gate 120 is connected by lead 122 to the output of octave prime coupler circuit 6. Octave prime coupler circuit 6 comprises a transistor 124 and an inverter 126. The base at transistor 124 is connected by one of the leads 38 to a corresponding key switch, for example, the key switch corresponding to the note C2. When the C2 key switch is closed by the operation of an organ key, voltage is applied on lead 38 to the base of transistor 124 turning transistor 124 "on" effectively grounding lead 128 to the input of inverter 126. Inverter 126 then provides logic one to the third input of NAND gate 120. Lead 128 is connected to the output of the next lowest octave prime control circuit 5.

Octave prime control circuit 5 comprises an inverter 130 which receives the signal from inverter 126 and inverts that signal on output lead 132. Output lead 132 would be connected to the next highest octave prime coupler circuit 6 on a corresponding lead 128. Thus, a logic zero input on lead 128 from the next lowest octave prime control circuit could produce a logic one input on lead 122 to NAND gate 120 simulating the closing of a corresponding key switch. Inverter 130 is enabled to provide an output on lead 132 by an input voltage (VccZ) on lead 134. Whenever an arpeggio mode is selected, VccZ voltage is present so that a key switch closure in one octave automatically couples all of the higher octavely-related decoder and pulser circuits. Accordingly, in an arpeggio mode, key switch information is at logic one on the third input lead 122 to each of the decoder NAND gates 120 corresponding to the closed key switches and all of the higher octavely-related notes. Thus, when a key is played, the corresponding input 122 goes to a logic one, and the counters 8 and 9 commence counting through the An–Bn combinations until a logic one occurs on all three input leads to the NAND gate 120. At this time, the output of NAND gate 120 on lead 28 changes to a logic zero which causes transistor 140 and pulser circuit 3 to commence conducting.

In all modes of operation other than the organ mode, the emitter of transistor 140 is at approximately 9 volts DC supplied by Note Played Trigger Bus 40. The Note Played Trigger Bus 40 is connected to all 61 emitters of the corresponding transistors 140 in the respective keyer arrangements 1-*a* through 1-*iii*. Base bias voltage VGE is supplied on lead 141 from FIG. 7. When one of the transistors 140 turns "on," current is detected on lead 40 by the clock control circuit 7 that indicates a note is being sounded. This information causes the clock control circuit 7 to stop the operation of counters 8 and 9 at that particular An–Bn count. Transistor 140 is held "on" for approximately 8 ms. until a one microfarad capacitor 142 charges and blocks the base current. By this time, a 4.7 microfarad capacitor 144 has been charged through a 470 ohm resistor 146 to a value closely approaching 9 volts. The junction of resistor 146 and capacitor 144 is connected by lead 148 through resistor 150 to the junction of diodes 152 and 154 in keyer circuit 1. The anode of diode 154 is connected to a bus 156 which is connected to all of the other corresponding keyers and to the input of tone color circuit 21.

When capacitor 144 is charged, diodes 152 and 154 are forward biased so that the tone signal on lead 25 is conducted to bus 156. Resistor 150 and capacitor 158 filter the square wave tone signal from the tone generator 19 to a sawtooth wave form. Percussive voicing (for all but the organ mode) is established by the rapid (8 ms.) charge of capacitor 144 in pulser 3 and slow decay through resistor 160 connected through diode 162 to sustain bus 164. Sustain bus 164 is connected to the sustain potentiometer 24*k* (see FIG. 1) which controls the sustain time. The sustain bus 164 is connected in common to all 61 keyer circuits.

The damper control circuit 4 provides for rapid decay when the key switch is released and damping is desired. Damper control 4 comprises an inverter 166 which detects key switch 17 operation through the connection to lead 128 in octave prime coupler 6. When damping is selected and key switch 17 closure is detected by inverter 166, the damper control and output to lead 36 of the keyer 1 is high impedance (open collector). When the key is released, the damper control 4 output becomes low impedance to ground, overriding sustain control of the keyer 1. Damping is removed when voltage (Vccw) is removed on lead 168 which is connected to the long sustain control 24N (see FIG. 1) thereby disabling inverter 166 to establish high impedance at damper control 4 output lead 36 independent of key switch 17 operation. When a key switch is released, and inverter 166 is enabled, output 36 goes to zero or ground causing rapid decay.

CLOCK CONTROL AND FREE RUNNING CLOCK

With reference to FIG. 8, a detailed circuit diagram of the clock control circuit 7 and the free-running clock circuit 23 is illustrated. Free-running clock 23 is a conventional free-running 100 Khz clock oscillator comprising inverters 171, 173, 175 which produces square waves at 100 KHz frequency. One output of clock circuit 23 is on lead 170 from inverter 169 which goes to the touch switch circuit (FIG. 15) and will be discussed later. The other output of clock 23 is on lead 172 which is connected to one input 174 of NAND gate 176. The other input 178 of NAND gate 176 must be a logic one to enable to search state to occur. When the other input 178 of NAND gate 176 is at logic zero the system clock input on lead 42 of the clock control circuit 7 will be in the hold state. The search and hold states of the system clock output lead 42 depend on the Q output logic state of JK flip-flop 180. Flip-flop 180 is continuously clocked on input 182 by the square wave pulses developed by free-running clock circuit 23.

Initially, with no keys played, the $\overline{\text{ANY KEY PLAYED}}$ input lead 184 to the base of transistor 186 is at logic one which turns transistor 186 "on" so that a logic one is present at the J input to flip-flop 180. At this time, the K input is at logic zero so the Q output of flip-flop 180 is a logic one. Therefore, the system clock output 42 is initially in the search state and shift register 70 in counter 8 is receiving system clock pulses at 100 KHz. However, with no keys played, the shift register 70 is held in clear by a logic zero on lead 72 (see FIG. 2). Accordingly, with no keys played in the arpeggio mode, counter 8 is receiving clock pulses and both counters 8 and 9 are held in clear so that counter 8 is outputting a logic one on lead A1 and counter 9 is outputting a logic one on output B1. The A1-B1 combination is then the position of origin for matrix scanning (see FIG. 3) and none of the sixty decoder circuits 2 are being addressed.

After one or more keys are played, the input line 72 to counters 8 and 9 goes to logic one (in a manner to be described later) and the shift registers 70 and 100 are no longer held in a clear state. Since the search state of the system clock output 42 is still gated to the shift register 70, matrix scanning begins from the A1-B1 position.

With reference to FIG. 8, when any keys are played, the $\overline{\text{ANY KEY PLAYED}}$ input 184 to the base of transistor 186 goes to logic zero as a result of operation of any key played detector 16 (FIG. 10). The J input of JK flip-flop 180 switches from logic one to logic zero and the K input of flip-flop 180 remains at logic zero. Under these conditions, the Q output of flip-flop 180 stays at logic one which enables the NAND gate 176 to continue to gate the system clock pulses to the system clock output 42.

A new An-Bn matrix position is decoded every ten microseconds by counters 8 and 9 so that the lowest note played is found typically in less than one millisecond. As previously explained with respect to FIG. 5, when a played note is located, transistor 140 turns "on" causing current to flow on note played trigger bus 40 connected as indicated in FIG. 8. Transistor 188 senses the current on note played detector bus 40 causing transistor 188 to turn "on" thereby biasing transistor 190 to also turn "on" causing its collector output to go to a logic zero which is inverted by inverter 192 to logic one and applied to the K input of JK flip-flop 180.

As pointed out previously, the shift register 70 of counter 8 is clocked by a low to high transition of the system clock pulses on output 42. With reference to FIG. 4, a typical wave form of the system clock output 42 during search and hold states is illustrated. During the search mode, square wave pulses appear on lead 42 at the 100 KHz frequency of the free-running clock 23. When a particular decoder circuit 2 detects its particular An-Bn matrix input and that its corresponding key has been played, the keyer circuit 1 is turned "on" causing the clock control 7 to switch to the hold state. It should be noted with respect to FIG. 8 that the clock input of the JK flip-flop 180 transfers data to the flip-flop on the high-to-low transition of the free-running clock 23 which is in phase with the system clock output on lead 42. Therefore, when a note is found, the K input of flip-flop 180 goes to logic one and 5 microseconds later the flip-flop 180 is clocked and Q output goes to logic zero which holds the system clock output 42 at logic zero. Since the next low to high system clock transition on lead 42 does not occur, the counters 8 and 9 remain at the matrix position where the note was found while the note is sounded.

The system clock output 42 will remain in the hold state until the J input to flip flop 180 goes to logic one. The source of this logic input depends upon logic information supplied by the logic interface 24. In the rhythm sync mode, one of the three $\overline{\text{Rhythm Sync Enable}}$ control lines 194, 196, and 198 is held at a logic zero by the rhythm sync switches (FIG. 6) and one of the corresponding diodes 200, 202 and 204 is forward biased to gate a timing clock pulse on one of leads 201, 203, and 205 developed by the rhythm divider 13 through a corresponding 0.001 microfarad capacitor 206, 208 and 210 connected in parallel to the base of transistor 186. The time between timing pulses provided by the rhythm divider 13 compared to the search time required to find a note is large so that the notes sound essentially at the rhythm timing of the rhythm divider 13.

When no $\overline{\text{Rhythm Sync Enable}}$ control line is held at a logic zero, the $\overline{\text{Any Rhythm Sync}}$ ($\overline{\text{ARS}}$) control line 212 is at a logic zero and timing is controlled by the rate monostable circuit 214 enclosed by the dotted lines at the upper left hand corner of FIG. 8. The $\overline{\text{ARS}}$ control line 212 is connected to the base of transistor 216 so that transistor 216 is held "on" by a logic zero present on $\overline{\text{ARS}}$ lne 212. Since the collector of transistor 216 is connected to the output of inverter 218, the J input of flip-flop 180 is controlled by the output of inverter 218.

A 4.7 microfarad timing capacitor 220 is connected between a five volt voltage source and one input 222 of integrated circuit 224 (enclosed in dotted lines at the upper center of FIG. 8). Integrated circuit 224 is a five transistor array arranged as shown in FIG. 8. The charging time for capacitor 220 is determined by the current "fork" arrangement comprising transistors 226 and 228 in integrated circuit 224 which in turn is controlled by the voltage on lead 230 to the base of transistor 226. When the system clock output 42 is in the search state, the $\overline{Q}$ output of JK flip flop 180 is at logic zero and the timing capacitor 220 is held discharged since the $\overline{Q}$ output is connected to base of transistor 232 causing transistor 232 to turn "on" applying bias to the base of transistor 234 causing transistor 234 to turn "on" so that capacitor 220 discharges through resistors 236 and 238.

When a note played trigger signal is detected, the $\overline{Q}$ output of JK flip flop 180 goes to a logic one causing transistors 232 and 234 to turn "off" so that timing capacitor 220 charges until sufficient bias is applied to the base of transistor 240 to cause transistor 240 to turn "on". When transistor 240 turns "on," bias is applied to the base of transistor 242 causing transistor 242 to turn "on" effectively grounding the input to inverter 218. When the input of inverter 218 goes to logic zero, the output of inverter 218 goes to logic one which in turn causes transistor 186 to turn "on" to apply a logic one of the J input of JK flip flop 180. The logic one on the J input of flip flop 180 is transferred through the flip flop to the Q output of the next clock pulse on input 182 causing the system clock output 42 to return to the high frequency search state. The $\overline{Q}$ output of flip flop 180 returns to logic zero discharging capacitor 220 as previously described so that the rate monostable circuit 214 is reset. Thus, the rate of charging of capacitor 220 determines the interval between sounding of notes.

The source of the voltage on lead 230 which regulates the charging time of capacitor 220 of the rate monostable circuit 214 depends on the input state of foot rate control line 244 from the foot rate control switch 246. When foot rate control switch is in its normal open position, the input on line 244 is an open circuit. Transistor 248 in integrated circuit 244 is held "on" by nine volts on its base so that the wiper arm 251 of rate pot 24j is coupled through transistor 248 and resistor 252 to the base of transistor 254 in integrated circuit 224. This coupling controls the charging time of capacitor 220.

When foot rate control switch 246 is closed, ground is applied to the emitter of transistor 256 and the base of transistor 248 so that transistor 248 is turned "off" so that rate pot 24j is not coupled to the base of transistor 254. Expression pedal potentiometer 258 has its wiper arm 259 connected to the base of transistor 260. By varying the resistance of expression pedal pot 258, the current through transistor 254 is correspondingly varied to control the charging time of timing capacitor 220. In this manner, the hold time between searches can be controlled and varied by expression pedal potentiometer 258 to regulate the interval of sounding of the notes during an arpeggio sequence.

To provide for single note reiteration, i.e., resounding of the same note repetitively at a subaudio frequency, it is necessary to generate a "false" note played trigger signal when there is a search from A2-B1 to A8-B8 (or from A8-B8 to A2-B1) since there is no actual note played trigger signal because the note was sounded on the previous scan of clocks 8 and 9 and there has been insufficient time for the pulser and gating circuits of the sounded note to recover and generate an actual note played trigger signal. When the end points of a scan of the clocks is reached, i.e., when either A2-B1 or A8-B8, a logic one is applied to lead 262 to NAND gate 264. Lead 262 is also connected to the clock input of JK flip flop 226 so that a logic one on the J input (5 volts) is also applied to the other input of NAND gate 264 so that a logic zero output is produced at the input of inverter 192. This causes the output of inverter 192 to go to logic one as has been previously described, when flip flop 180 is clocked five microseconds later, the Q output goes to logic zero which holds the system clock output 42 at logic zero. This state is held for the hold time which allows the pulser and keyer circuits sufficient time to recover so that the note that has been played will be found on the next search scan. The result is a single note reiteration at a rate one-half the rate of the sounding of multiple notes. JK flip flop 266 is cleared when a note is played by transistor 265 which grounds the clear input when it turns "on".

Reiteration flip-flop 266 is initialized (cleared) by A1-B1, i.e., the matrix reset position. A1-B1 is detected by NAND gate 267 and gated to the clear (CLR) input of flip-flop 266 during the search portion of the system clock by NAND gate 268 and inverter 269 to clear flip-flop 266. It should be noted that the necessary condition for one note reiteration (A2-B1 and A8-B8 both occur without note-found detection) is encountered in arpeggio up repeat mode as the scan goes around the loop, i.e., A8-B8 to A2-B1, searching for the next note to sound. In this case, the reiteration circuit must be inhibited or a false trigger will be detected at A2-B1. In this cae A1-B1 detection resets the reiteration flip-flop 266 and a false trigger is not produced.

It has previously been pointed out that matrix scanning is accomplished by applying the system clock on lead 42 to counter 8 which generates the clock for counter 9 from the specified counter 8 transistions. In time, counter 8 is clocked from A8 to A1 and changes states before counter 9 is clocked from B8 to B1. The result is that the information output of counters 8 and 9 is incorrect for a very short period of time. The resulting invalid information can be called false AB addresses. Gate delays and register settling time also produce false AB addresses. If a false AB address corresponds to a closed key switch, the pulser 3 is activated and a note-found trigger is produced on note played trigger bus 40. The capacitor 271 across the emitter and base of transistor 188 delays transistor 188 from turning "on" so that the note found detector does not respond to the short duration false AB address triggers. Since the normal duration of a note found trigger pulse fully charges capacitor 271, and capacitor 271 may not decay sufficiently to ignore false AB address triggers produced on the following search, it is necessary to "reset" or discharge the capacitor 271. Transistor 273 rapidly discharges capacitor 271 to each low-to-high transition of the system clock which is gated by NAND gate 275 to the base of transistor 273 when the system is not in organ mode ($\overline{OM}$=logic 1) and during clearing of counters 8 and 9 by sequence control 12 (i.e., ($\overline{SQ1}.\overline{SQ2}$ Y) goes to logic zero. This occurs on the high-to-low transition of the system clock.

COUNTER CONTROL CIRCUIT

With reference to FIG. 9, the counter control circuit 14 and the matrix end decoder circuit 11 are illustrated. The two primary functions of the counter control circuit 14 are counter direction control by the up/down function control circuit 14A and start/stop control by the start/stop function control circuit 14B. The input information to the counter control circuit 14 can be of two types, i.e., static information and dynamic information. Static information remains at a fixed logic level during a particular mode of operation. Dynamic information can change states during the mode of operation. In counter control circuit 14, the static information determines which of the dynamic information inputs will be gated for dynamic control. The matrix end address decoder circuit 11 generates dynamic information for both functions of counter control 14. The end positions which bracket the 64 word matrix corresponding to the notes are A2-B1 and A8-B8 (see FIG. 3). For a matrix scan in either direction, the scan starts from the reset position at A1-B1 and must encounter one end point (A2-B1) before reaching any of the note positions or the second end point (A8-B8) after scanning all of the note positions. The matrix end address decoder circuit 11 generates a logic pulse for each of the end points A2-B1 and A8-B8. The A2-B1 and A8-B8 logic pulses are connected to the inputs of NAND gates 270 and 272 respectively. The output of NAND gates 270 and 272 are inverted by inverters 274 and 276 which are respectively connected to the input of OR gate 278 so that a logic one appears on lead 262 connected to NAND gate 264 in FIG. 8 for production of the one note reiteration function as previously described.

The up/down function control 14A generates direction control logic signals for use by counters 8 and 9 in FIG. 2. OR gate 280 is a programmable inverting or non-inverting gate. The Reverse Direction input lead 282 determines whether the $\overline{Q}$ output of JK flip flop 284 is inverted or not inverted at the output 308 of gate 280. The normal logic for Reverse Direction is at a static logic one so that $\overline{Q}$ output of flip flop 284 is inverted at the output 308 of gate 280. Flip flop 284 is clocked by the high to low transitions of the system clock output lead 42 applied to the clock input 286. The J and K inputs of flip flop 284 are connected to the output of NAND gates 288 and 290. The inputs of NAND gates 288 and 290 are respectively connected to the outputs of NAND gates 292, 294, 296 and 298. The two level gating system provided by NAND gates 288-298 are statically controlled on the two direction enable (TDE) input lead 300 and the Reverse lead 302. The two direction enable TDE lead 300 is an output of the logic interface 24 (FIGS. 7A and 7B) and the logic state on lead 300 depends upon the particular mode of operation selected by the operator. When the TDE input 300 is logic one, matrix end point pulses are gated to flip flop 284. When an up/down arpeggio is selected, TDE input 300 is logic one and the A2-B1 and A8-B8 end points control matrix scanning by reversing the scan direction of counters 8 and 9 at the end points. When an up arpeggio is selected, TDE lead 300 is at a logic zero so that the matrix scan direction is not reversed.

As previously pointed out with respect to FIG. 2, the logic state on lead 74 to shift registers 70 and 100 determines the direction of the scan. With a logic one on lead 74, operation of the shift registers 70 and 100 are in the serial or up mode of operation. A zero logic state on lead 74 produces a parallel or reverse mode of operation for the down scan. Lead 74 is connected to lead 304 which is connected to the output of NOR gate 306 of up/down function control 14a in FIG. 9. NOR gate 306 inverts the output of OR gate 280.

The Reverse static input lead 302 to the up/down function control 14A is directly connected to the reverse switch 380 (FIG. 6). The logic state of Reverse determines whether the J or the K input of the flip flop 284 will receive new key information. A new key pulse is generated when the keys are first played so that the initial direction of the matrix scan is determined by the logic state of Reverse lead 302. When Reverse is logic one, and keys are played, a pulse is generated by the new key detector circuit 15 (FIG. 10) which is applied on lead 310 to the input of NAND gate 292. This causes the K input of flip-flop 284 to go to logic one while the J input remains at logic zero. The $\overline{Q}$ output of flip flop 284 is clocked to a logic one and the matrix is scanned in the up direction. It should be noted that when the counters count up encountering A2-B1 and if TDE lead 300 is logic one, the K input of flip flop 284 receives a second pulse. However, $\overline{Q}$ is already in the state dictated by the logic one at K. When A8-B8 is scanned, the J input of flip flop 284 goes to logic one and the scan direction is reversed as previously described. If a new key is detected while scanning down, the K input of flip-flop 284 receives a pulse and the direction of scan is set back to the initial direction of scan.

If a new key is played while the system clock is in the hold state, the new key detected information is held by a latch to insure that the information is present when the system clock goes to the search state and clocks the JK flip-flop 284. The new key detector and latch circuit will be discussed further below with respect to FIG. 10.

The start/stop function control 14B enables matrix scanning when a logic one appears on the lead 72 at the output of NAND gate 314, or holds the output of counters 8 and 9 at A1-B1 when a logic zero appears on lead 72. As previously pointed out with respect to the discussion of counters 8 and 9 (FIG. 2) lead 72 is the clear input line to both of the shift registers 70 and 100. The $\overline{Q}$ output of JK flip-flop 312 is connected to both of the inputs of NAND gate 314 so that it inverts the $\overline{Q}$ signal. The Q output of flip-flop 312 is connected to start lead 311 (FIG. 7B). JK flip-flop 312 is clocked by the system clock lead 42 and is cleared by a pulse on lead 316 from the Any Key Played detector 16 (to be more fully described hereinafter). The J and K inputs of flip-flop 312 are controlled by a system of NAND gates 318-328. If either of inputs 330 or 332 to NAND gate 328 are held at a logic zero, the J input of flip-flop 312 is logic one and the K input is logic zero. Under these conditions, with flip-flop 312 not in clear, the $\overline{Q}$ output of flip-flop 312 can be clocked to logic zero and matrix scanning can take place. Therefore, in order to start searching for a note to sound, a logic zero is required on lead 330 or 332 of NAND gate 328. The remaining gates 318-326, as will be described hereinafter, only control the K input to stop matrix scanning. Input 330 (Repeat) to gate 328 is at logic zero when either the multi or organ modes are selected. In other modes, matrix scanning must be enabled by a logic zero on lead 332 before the Repeat input on lead 330 is enabled by logic zero. The touch switch logic circuit which generates the Repeat input will be discussed later (FIG. 13).

In all but the organ and multi modes of operation, Start information may result from New Key Trigger Latch information supplied on lead 310. When keys are played, Any Key Played lead 316 goes to logic one to the clear input of flip-flop 312 enabling information to be transferred through flip-flop 312. At the same time, the new key played detector 15 (FIG. 10) generates a logic one pulse on lead 310 approximately 70 milliseconds in length. The system clock is in the search state so that the up/down function control 14A transfers an initial direction control to the counters 8 and 9 on leads 304 and 308 (see FIG. 2) as previously described. Seventy milliseconds after the keys are played, the new key trigger latch input 310 goes to logic zero which couples a logic zero pulse to the input 332 of NAND gate 328. With the next high to low system clock transition on lead 42, $\overline{Q}$ of flip flop 312 is clocked to a logic zero and matrix scan begins. The delay between the playing of keys and beginning of scan not only permits direction control set up time but also allows all the key switches to be fully closed by the organist before scanning begins.

In a non-repeat mode of operation, such as arpeggio up or arpeggio up/down, the counters 8 and 9 must reset to A1-B1 after one arpeggio sequence. This is accomplished by the appropriate matrix end point logic one pulses being applied to the K input of flip-flop 312 through the NAND gate system 318-328 which permits $\overline{Q}$ to be clocked to logic one. The matrix end point (either A2-B1 or A8-B8) which is gated to halt matrix scanning is determined by the mode detected by OR gate 334. OR gate 334 is operated as a controlled inverting or non-inverting data coupler with input 336 connected to $\overline{\text{Reverse}}$ input 302 as the control. The other input 338 applies a logic zero whenever an arpeggio up/down ($\overline{\text{UD}}$), or a note pattern 3 ($\overline{\text{SQ3}}$) or a touch strip mode ($\overline{\text{TSA}}$) has been selected. For example, if the programmed mode is arpeggio up/down, and the reverse and repeat modes are not selected, input 338 of OR gate 334 is at logic zero and input 336 is at logic one so that the output of OR gate 334 is at logic one and the A2-B1 information is coupled to the K input of flip-flop 312 through NAND gates 320, 322 and 326. It should be remembered that matrix scanning is initiated by the new key trigger latch input 310 when that input goes from a logic one to a logic zero which couples a logic zero through the 0.1 microfarad capacitor 340 to input 332 of NAND gate 328. It takes approximately 200 microseconds for the capacitor 340 to recover and for input 332 to return to the logic one state. Since this start mechanism overrides matrix end stop operation for a period of 200 microseconds, the A2-B1 end point is passed over on the up scan and found on the return down scan long after the capacitor 340 has recovered.

Inverter 271 yields $\overline{\text{A2B1}}$ on lead 281, and inverter 273 yields $\overline{\text{A8B8}}$ on lead 281. Inverter 275 invertes the new key trigger latch information on lead 310 to produce $\overline{\text{New Key}}$ on lead 281. Lead 281 is connected to FIG. 11 as will be described below.

NEW KEY PLAYED DETECTOR AND ANY KEY PLAYED DETECTOR

With reference to FIG. 10, the new key played detector circuit 15 and the any key played detector circuit 16 are illustrated. When any key switch 17 (see FIG. 1) is closed, a positive voltage is applied to the key switch common input 342 which is connected to one side of diode 344 in circuit 15 and the base of transistor 346 in circuit 16. The presence of voltage at the base of transistor 346 turns that transistor "on" thereby turning transistor 348 "on" so that the $\overline{\text{Any Key Played}}$ output 184 (connected to $\overline{\text{Any Key Played}}$ input 184 in FIG. 8) goes to logic zero and the Any Key Played output 316 (connected to input 316 in FIG. 9) goes to logic one, as a result of the inversion by inverter 350. Also provided is an inverter 352 whose output 354 also represents the Any Key Played logic to the sequence control 12 (FIG. 11) as will hereinafter be described.

The new key played detector 15 is sensitive to voltage changes at the key switch input 342 resulting from resistor paralleling between the key switch gated supply voltage and the key switch common input 342. Transistor 356 amplifies the voltage change and produces a pulse representative of the voltage change. Transistor 358 detects the pulse developed by transistor 356 and transistor 360 forms a hysteresis loop around transistor 358 to maintain the pulse duration for approximately 70 milliseconds thereby holding transistor 362 "on" for a period of 70 milliseconds when a new key is played. With transistor 362 "on," the $\overline{\text{New Key Trigger}}$ output 364 goes to logic zero for 70 milliseconds when a new key is played. The New Key Trigger Latch output 310 goes to a logic one as a result of inverter 366 for at least 70 milliseconds and is latched to a logic one during the hold state of the system clock when the $\overline{\text{system clock}}$ input 368 from the clock control 7 (see FIG. 8) is at logic one. NAND gate 370 operates as the latching element. The remaining output 372 of key play detector circuit 15 transmits new key pulse information (TS NKT) for use by the touch switch logic circuit 24Q (FIG. 13) as will be described hereinafter.

MODE SWITCHING AND LOGIC INTERFACE

The present invention is programmed by switch controls (FIG. 6) on a control panel on the face of the organ. A system of logic interface gating circuits (FIGS. 7A and 7B) is used to combine the switch programming and generate static control signals on output lines to the logic system. The control panel switch wiring is illustrated in FIG. 6. The switches comprise the 1/16, ⅛, and ¼ real rhythm sync switches 374, 375, and 376 respectively (block 24h in FIG. 1), and the note pattern (3), (2), and (1) switches 377, 378, and 379 respectively (block 24g), the reverse switch 380 (block 24f), the multi switch 381 (block 24e), the repeat switch 382 (block 24d), the strum switch 383 (block 24c), the up/down arpeggio switch 384 (block 24b), the up arpeggio switch 385 (block 24a), and the organ mode switch 386 (block 24o). Foot rate switch 246 has previously been described with respect to FIG. 8. The various switches 374-386 are priority wired to override when multiple switching dictates incompatible modes of operation (such as note pattern 1 and note pattern 2). The various outputs of the switching circuits are identified by the numerals 194, 196, 198, and 393-416 adjacent to which written descriptions are provided in FIG. 6 to indicate the logic content at these outputs. The rhythm sync enable outputs 194, 196 and 198 are connected to the same numbered inputs in FIG. 8. The following is a list of mnemonic definitions which will assist in understanding the Boolean algebraic logic equations hereinafter presented to explain the logic interface 24 in FIGS. 6, 7A and 7B.

ARS—Any Rhythm Sync ("on" at logic one)
ASQ—Any Sequence ("on" at logic one)
[A]ME—enable counter 8 multi mode ("enable" at logic zero)

[B]ME—enable counter 9 multi mode ("enabled" at logic zero)
DB—downbeat pulse from rhythm unit 20
MT—Multi mode ("on" at logic one)
NM—normal mode output ("on" at logic one)
NORM—normal mode programmed by all mode switches off ("on" at logic one)
OM—Organ Mode ("on" at logic one)
PC—Pulse Clear for counters 8 and 9 from touch switching logic 249 ("clear" at logic zero)
RpS—repeat switch ("on" at logic one)
$\overline{Repeat}$—output for arpeggio, strum, or sequence repetition ("on" at logic zero)
RpT—automatic repeat in multi mode ("on" at logic one)
$\overline{RR}$—counter 8 and 9 reset ("clear" at logic zero)
$\overline{RO}$—rhythm on, output of kick switch interface circuit ("on" at logic zero)
RKS—rhythm kick switch indicator ("on" at 12 volts, "off" at 27 volts)
$\overline{SQ1}$—note pattern (sequence) one ("on" at logic zero)
$\overline{SQ2}$—note pattern (sequence) two ("on" at logic zero)
$\overline{SQ3}$—note pattern (sequence) three ("on" at logic zero)
$\overline{ST}$—strum switch output ("on" at logic zero)
$\overline{STn}$—strum normal position output (strum "off" at logic zero)
TDE—two direction enable output ("enabled" at logic one)
TS—touch switch output ("on" at logic one)
$\overline{TSA}$—touch logic output ("on" at logic zero)
$\overline{TSB}$—touch logic output (overrides TDE with logic zero)
$\overline{TSC}$—touch logic output ("on" at logic zero)
$\overline{TSF}$—touch override [A] multi-injection
$\overline{TSBP}$—touch logic blanking pulse during switching ("on" at logic zero)
$\overline{TSG}$—touch override [B] multi-injection
$\overline{UD}$—up/down arpeggio ("on" at logic zero)
$\overline{UP}$—up arpeggio ("on" at logic zero)
VCCZ—5 volt supply to octave prime coupler inverters
X,Y,Z,—sequence pattern rhythm divider outputs
VGE—voltage for keyer gating (9 volts when not in organ mode, 15–22 volts in organ mode)
VGC—Keyer gate voltage (VGE) after blanking transistor (FIG. 7B)
MT*—normally open multi contacts, information transferred when multi-button is on (contacts closed)
MT**—normally closed multi contacts, information transferred when multi-button off
ST*—information transferred when strum switch is closed The logic gating circuitry in FIGS. 7A and 7B operates in a conventional manner and may be analyzed in accordance with conventionally known principles of Boolean algebra. Accordingly, rather than belabor the specification with an item by item description, the operation of the circuit illustrated in FIGS. 7A and 7B will be described in terms of the applicable Boolean algebraic logic equations which will be readily understood by anyone skilled in the art.

The $\overline{Repeat}$ output 330 of the switch interface circuit illustrated in FIG. 7A and 7B determines whether or not an arpeggio or note pattern will halt when an appropriate matrix end point is reached after an initial scan. $\overline{Repeat}$ output 330 is connected to one input of NAND gate 328 in start/stop function control 14B in FIG. 9. $\overline{Repeat}$ output line 330 is negative true logic and NAND gate 320 detects a $\overline{Repeat}$ output as a logic zero for scan repetition as previously described. The logic signals on $\overline{Repeat}$ output 330 follows the following logic equation:

$$\overline{Repeat} = OM + RpT = TSD + Start \cdot (RpS + \overline{SQ1} \cdot \overline{SQ2})$$

For example, when organ mode is programmed when the organ mode switch 386 (see FIG. 6) is actuated, OM is logic one, and therefore $\overline{Repeat}$ goes to logic zero. Similarly, RpT goes to logic one with operation of multi-mode switch 381 (see FIG. 6) for scan repetition. If RpS is at logic one, or $\overline{SQ1}$ or $\overline{SQ2}$ is at logic zero, and Start is at logic one, the result will be scan repetition with $\overline{Repeat}$ going to logic zero. Anding with the Start logic signal causes a 70 millisecond delay after the keys are first played (as previously described with respect to counter control 14 discussion).

The multi-tone injection circuit 10 (see FIGS. 1 and 2) has the function of altering the normal bit content for each word in one or both of the counters 8 and 9 so that octavely related notes are played simultaneously during an arpeggio for a fuller, richer sound. A logic zero on the [A]ME output line 420 enables the multi-operation of counter 8 in accordance with the following equation:

$$\overline{[A]ME} = (MT \cdot (\overline{ST})) \cdot (UP^* + UD^*) \cdot \overline{OM} \cdot \overline{TS} \cdot F \cdot (\overline{SQ1} + \overline{SQ2} + \overline{SQ3})$$

Accordingly, it should be apparent that for $\overline{[A]ME}$ to be at logic zero, the multi-switch 381 must be actuated (MT at logic one), the strum buttom 383 must be in the normal position as shown in FIG. 6 (so that $\overline{ST}$ is at logic one), either the up, or the up/down arpeggio switch 384, 385 must be closed, the organ mode switch 386 must not be placed in the organ mode ($\overline{OM}$ at logic one), and the organ cannot be in the touch mode ($\overline{TSF}$ at logic one) and none of the note pattern switches 377, 378 and 379 actuated (($\overline{SQ1} + \overline{SQ2} + \overline{SQ3}$) at logic one).

Similarly, a logic zero on the multi-injection enable control line $\overline{[B][ME]}$ 422 enables the multi operation of counter 9 in accordance with the following logic equation:

$$\overline{[B]ME} = (MT \cdot (\overline{ST})) \cdot (UD^*) \cdot \overline{OM} \cdot \overline{TS} \cdot G \cdot (\overline{SQ1} + \overline{SQ2} + \overline{SQ3})$$

It should be noted that $MT \cdot (\overline{ST}) \cdot (\overline{SQ1} + \overline{SQ2} + \overline{SQ3})$ is used in other control functions and may be abbreviated at $\overline{RpT}$. Therefore, the above $\overline{[A]ME}$ and $\overline{[B]ME}$ logic equations are reduced to $\overline{[A]ME} = \overline{RpT}(UP^* + UD^*) \cdot \overline{OM} \cdot \overline{TSF}$ and $\overline{[B]ME} = \overline{Rpt}(UD^*) \cdot \overline{OM} \cdot \overline{TSF}$.

The two direction enable TDE output 300 in FIG. 7B is connected to the corresponding input in FIG. 9. A logic one on the TDE control line 300 to the up/down function control circuit 14A causes the matrix scan of counters 8 and 9 to turn around upon detection of the matrix end points. The TDE logic output follows the following logic equation:

$$TDE = \overline{RpT} \cdot ST^* \overline{(UD \cdot TSA)} \cdot \overline{SQ1} \cdot \overline{SQ2} \cdot \overline{UP} \cdot \overline{OM} \cdot \overline{TSB}$$

From this equation, it can be seen that since most of the terms for TDE are anded together, most of these logic inputs inhibit two direction scanning. For example, when the up arpeggio switch 385 is closed (without priority override) $\overline{UP}$ is a logic zero and TDE is logic zero. The term ST* ($\overline{UD \cdot TSA}$) is at logic zero when strum switch 383 and up/down arpeggio switch 384 are operated. The $\overline{TSA}$ input is programmed by the touch switch logic 24Q as will be more fully described hereinafter. With the strum switch 383 closed, $\overline{UD \cdot TSA}$ is detected and if either $\overline{UD}$ or $\overline{TSA}$ is at a logic zero (strum or up/down programmed), the quantity ($\overline{UD \cdot TSA}$) is logic one and TDE is logic one. Therefore, the notes are sounded in both directions of the scan whereas when the strum switch alone is operated, the notes are scanned in only one direction.

The up/down arpeggio or note pattern three or touch switch logic output ($\overline{UD \cdot SQ3 \cdot TSA}$) output 338 in FIG. 7B is connected to one input of OR gate 334 in FIG. 9 to control up/down function control 14B as previously described. This input determines which matrix end point can be recognized to halt matrix scanning as previously described. The logic equation for this output line 338 is, of course, ($\overline{UD \cdot SQ3 \cdot TSA}$). This equation means, of course, that each of the terms $\overline{UD}$, $\overline{SQ3}$, and $\overline{TSA}$ must be at a logic one for the output on 338 to be a logic one. If any term goes to the logic zero, the lead 338 goes to logic zero.

The $\overline{RR}$ (Register Re-set) output 72 in FIG. 7B is connected to the clear inputs of shift-registers 70 and 100 in FIG. 2 as previously described. When this control line is at logic zero, outputs (QA, QB, QC, QD) of both shift registers 70 and 100 are also held at a logic zero.

There are three sources of logic information for the clear inputs to shift registers 70 and 100. One source is the NM input lead 424 in FIG. 2 (from FIG. 7B) which is connected through inverter 426 to clear lead 72. The second source of logic information is from the output 72 of the start/stop function control circuit 14B in FIG. 9 which has previously been discussed. The third source of information is $\overline{RR}$ from the interface circuitry illustrated in FIGS. 7A and 7B.

The $\overline{RR}$ output 72 in FIG. 7B provides logic pulse information for momentarily resetting the counters 8 and 9 to A1, B1 in accordance with the formula:

$$\overline{RR} = \overline{PC} \cdot [\overline{SQ1 \cdot SQ2}) \overline{Y}] \text{pulse} \cdot (\overline{ARS \cdot SQ3 \cdot TS \cdot AS \cdot DB})$$

$\overline{PC}$ is an output of the touch switch logic 24Q (FIG. 13) which resets the counters 8 and 9 during a touch switch transitiion with a short duration logic zero. The term ([($\overline{SQ1 \cdot SQ2}$)$\overline{Y}$] pulse) is used to generate a reset when either note pattern (1) or note pattern (2) is selected by the appropriate operation of a note pattern switch 379 or 377 (FIG. 6). The static term ($\overline{SQ1 \cdot SQ2}$) is at logic one when note pattern (1) or (2) is programmed so that a short duration logic one is generated when $\overline{Y}$ goes from logic zero to logic one. $\overline{Y}$ is a timing pulse in note pattern generation supplied by the sequence control 12 (to be described below) when $\overline{Y}$ goes from logic zero to logic one. The timing is such that a note pattern sequence is reset by setting counters 8 and 9 to A1-B1 so that the pattern can be repeated. The term ($\overline{ARS \cdot SQ \cdot 3 \cdot TS \cdot AS \cdot DB}$) is a function which represents the conditional gating of the downbeat DB information from the rhythm divider 13 to reset the counters 8 and 9 to A1B1 so that the lowest note played is the first note found after the downbeat. The static conditions necessary from downbeat reset are Any Rhythm Sync (ARS) at logic one, Any Sequence (ASQ) at logic one, note pattern (3) not "on" ($\overline{SQ3}$ at logic one), and the touch switch not activated ($\overline{TS}$ at logic one).

The organ mode overrides all other modes of operation. The input to the switch interface circuit of FIG. 7A and 7B from the organ mode switch 386 in FIG. 6 is labeled VGE input 414 (see FIG. 7A). In the non-organ mode of operation, switch 386 is in the normal position illustrated in FIG. 6 so that VGE is at +9 volts DC. When the organ mode is programmed, switch 386 is switched to the opposite position illustrated in FIG. 6 so that between 15 and 22 volts DC is applied to the emitter of transistor 428 in FIG. 7A turning that transistor "on." The collector of transistor 428 is connected to the base of transistor 430 so that that transistor is turned on when transistor 428 is turned "on." The collector of transistor 430 is connected to $\overline{OM}$ output 432. In the organ mode, $\overline{OM}$ is logic zero when transistor 430 is turned "on" by transistor 428.

As previously described with respect to clock control 7 in FIG. 8, the voltage VGC on lead 41 is the voltage source for the note played trigger buss 40. The VGC input 41 to FIG. 8 is shown in FIG. 7B. Transistors 434 and 436 make up a voice blanking circuit to "blank" voices or notes sounding for a short duration of time during mode switching. This is necessary, for example, if an arpeggio mode is programmed, but while the keys for the arpeggio are being held down, the arpeggio button is returned to the normal position thereby programming for the normal mode of operation. When this occurs the notes held will be sounded as if they had just been played if a blanking circuit is not provided. With the blanking circuit, the transistor 140 in pulser circuit 3 will be disabled so that no bias current is provided to the keyer 1, and further actuation of keys will be required before a note will be sounded. Transistor 436 is normally held in saturation so that VGC on lead 41 is approximately equal to VGE on lead 414. During switching, transistor 434 is pulsed "on" to turn transistor 436 "off" blocking the charging current to keyer 1. Voice blanking takes place when either the normal mode or organ mode is programmed.

Normal mode (NM) is programmed by the FIGS. 6, 7A, and 7B logic interface circuits when NM lead 424 goes to a logic one in accordance with the following logic formula.

$$NM = (NORM + (\overline{RO \cdot ARS \cdot TS})) \cdot \overline{TSB \cdot OM}$$

The $\overline{TSB}$ output of the touch switch logic circuit 24Q (FIG. 13) converts the normal to arpeggio up when normal mode has been programmed and the touch switch has been programmed and the touch switch has been operated. The operation of the touch switch logic circuit 24Q in FIG. 13 will be described in more detail below. At this point it should be understood that without touch switch operation, $\overline{TSB}$ is at logic 1. NORM goes to logic one when all other mode switches (except organ mode) are in their normal positions. NORM follows the following logic formula.

$$NORM = \overline{Up \cdot UD \cdot TSA \cdot ST \cdot SQ1 \cdot SQ2 \cdot SQ3}$$

The quantity ($\overline{RO \cdot AR \cdot TS}$) goes to logic one when any one of three rhythm sync switches 374, 375, or 376 (FIG. 6) are actuated (ARS goes to logic one), the rhythm unit 20 has not been turned on ($\overline{RO}$ at logic one), and the touch switch 24Q has not been operated ($\overline{TS}$ at logic one). $\overline{OM}$ overrides normal mode programming when organ mode is programmed and $\overline{OM}$ is at logic zero. When not overridden by organ mode or touch switch operation, normal mode can be programmed by either all mode switches being in the normal position or by rhythm sync programming when the rhythm unit 20 is not running.

As previously described with respect to the description of FIG. 5, octave prime control circuit 5 primes higher octave operation by supplying voltage VccZ to inverters 130. Thus, when VccZ equals zero no octave coupling occurs because inverters 130 are disabled, and when Vccz equals +5 volts DC, there is octave coupling. The octave prime control source (VccZ) is supplied from lead 134 in switch interface circuits 24 in FIG. 7A and 7B in accordance with the following logic formula.

$$VccZ = (\overline{ASQ \cdot STN \cdot OM \cdot TS}) \cdot ([MT^{**}(\overline{NM \cdot OM}) \cdot \overline{SQ \cdot 2}] \cdot [MT^*(\overline{NM \cdot OM}) \cdot \overline{SQ2}] + \overline{TSC})$$

The first quantity $(\overline{ASQ \cdot STN \cdot OM \cdot TS})$ provides for octave prime control from the strum switch 383. When the strum switch 383 is closed, $\overline{STN}$ is logic 1. When each of the other terms $(\overline{ASQ}, \overline{OM}, \overline{TS})$ are logic 1 then the first term is logic zero and VccZ is logic zero (i.e., Vcc equal zero volts). It should be noted that the strum switch operation is overridden by any sequence $(\overline{ASQ}$ at logic zero), or organ mode (OM), or converted to arpeggio up by the touch switch (TS) at logic zero.

In the second quantity in the above equation, it should be recognized that the bracketed terms, i.e., the first term including MT** and the second term including MT* are mutually exclusive and cannot exist at the same time. With the multi-switch 381 in the normal position, the first bracketed term MT** applies, and with the multi-switch 381 on, the second term (MT*) applies. In either the organ mode or normal mode, the quantity $(\overline{NM \cdot OM})$ is logic zero so that octave priming is provided when multi-switch 381 is closed and octave coupling is inhibited when the multi-switch 381 is in its normal open position as illustrated in FIG. 6. When note pattern (2) switch 378 is actuated, $\overline{SQ2}$ goes to logic zero (SQ2 to logic one) so that VccZ equals zero in either position of multi-switch 381. TSC is an output from the touch switch logic circuit 24Q (FIG. 13) which enables octave coupling when TSC is at logic one ($\overline{TSC}$ at logic zero).

SEQUENCE CONTROL

With respect to FIG. 11, the sequence control circuit 12 is illustrated. This circuit controls the direction of matrix scan of the counters 8 and 9 so that three different note patterns can be sounded by dynamic control of the direction of the matrix scan, the note found detection circuit, and the pulse reset of the counters 8 and 9 during the usual operation of the arpeggio mechanism. The specific time during which the sequence control output is active depends on which note of the sequence is to be sounded. The note patterns are all periodic and note pattern (1) (SQ1) is repeated after eight notes, note pattern (2) (SQ2) is repeated after four notes, and note pattern (3) (SQ3) is repeated (for sequence control purposes) every other note.

The timing wave forms produced by sequence control 12 are shown in FIG. 12. With respect to FIG. 11, JK flip-flops 440, 442, and 444 are wired for divide by two operation. JK flip-flop 440 is clocked by Search on lead 369 (from $\overline{Q}$ output of flip-flop 180 in the clock control circuit 7, FIG. 8). Search is at logic one during the hold state of the clock control circuit and logic zero during the search state. The Q output of divider 440 is labelled X and the X output clocks the second divider 442 on each high to low transition of the X output. The second divider 442 has a Q output labelled Y and the Y output clocks flip-flop 444 on each high to low transition. The Q output of flip-flop 444 is labelled Z. The X, Y and Z wave forms are shown in FIG. 12, and it should be noted that there are eight different logic combinations possible on the X, Y and Z lines. Dividers 440, 442, and 444 are cleared by zero logic on inputs 446, 448, and 450 respectively. Dividers 440 and 442 are held in clear until keys are played and the Any Key Played control line 354 (connected to FIG. 10) goes to logic one. Flip-flop 444 is cleared by zero input in $\overline{\text{New Key Trigger}}$ lead 364 from FIG. 10. The downbeat information (DB) on lead 452 is provided by the rhythm unit 20 and operates on the divider clear inputs to initialize dividers 440, 442 and 444 to insure that the note patterns are in step with the rhythm timing. Thus, when a downbeat pulse (DB) is received on lead 452, transistor 454 turns "on" grounding the input to inverter 456 so that inverter 458 applies zero logic to clear inputs 446 and 448. This assures that the note patterns are in step with the rhythm timing. A zero input on $\overline{\text{Seq Count Reset}}$ lead 460 (connected to FIG. 13) causes the dividers 440 and 442 to clear to their initial state during touch switch mode of operation as will be more thoroughly described hereinafter.

When the fourth note rhythm sync switch 376 (see FIG. 6) is operated and a logic one input is present on lead 194 in FIG. 11, NAND gate 462 operates to prevent flip-flop 444 from being reset when the downbeat occurs. In fourth note rhythm sync, the downbeat occurs every four notes which would cause an eight note pattern to be terminated. Thus, flip-flop 444 is inhibited from being reset when fourth note sync switch 376 has been operated. In addition, the downbeat occurs approximately 20 milliseconds ahead of the sixteenth note rhythm sync transition on lead 496. Transistor 454 and NAND gate 464 form a latch mechanism to hold the downbeat information until the sixteenth note sync transition is detected.

With reference to FIGS. 7A, 7B, and 11, the dynamic timing information of the sequenced control 12, i.e., the X, Y, and Z outputs from flip-flops 440, 442, and 444, is combined with static note pattern switch outputs, i.e., $\overline{SQ1}$, $\overline{SQ2}$, and $\overline{SQ3}$, by the logic gating circuit 466 comprising inverters 468 and NAND gates 470. The outputs of the logic gating circuit 466 are Reverse Direction lead 282, Defeat lead 472, $\overline{SQ1}$ . $\overline{SQ2}$, lead 474 and $\overline{Y}$ lead 476. These outputs control the arpeggio sequence dynamically when enabled by the note pattern mode selected by note pattern switches 377, 378, and 379 (FIG. 6).

The Reverse Direction output lead 282 of the sequence control 12 is connected to the corresponding lead in the up/down control circuit 14A in FIG. 9, and as previously described, reverses the direction of operation of counters 8 and 9. When note pattern (3) is selected (switch 377 operation, FIG. 6), the Reverse Direction output 282 is inhibited when a new key is played or an end point of the matrix is encountered by flip-flop 478. Thus, an input on lead 281 clocks flip-flop 478 changing the state of the $\overline{Q}$ output 482 so that when note pattern (3) is selected and a new key operation starts the scan, the initial direction of scan is statically programmed. Also, when a matrix end point is expected to reverse the static direction of scan of the counters 8 and 9, there will be no scan turn around. The $\overline{Q}$ output 482 is cleared when a reset pulse is received on lead 484 which is also connected to the clock input of JK flip-flop 486.

As previously pointed out, the Defeat output 472 of sequence control 12 goes to the clock control 7 (see FIG. 8. When Defeat output 472 goes to logic one, the K input of flip-flop 180 (FIG. 8) is clamped to a logic zero, and the note found detection information provided by transistors 188 and 190 is blocked. Therefore, the search state of the system clock is maintained even though a note is detected (the defeated note is actually sounded for 10 microseconds which is too short a period for audible recognition). Although nothing is heard, the fact that the note is found and instantaneously played causes a pulse on Note Found lead 475 (from FIG. 8) which operates to clear flip-flop 286 (FIG. 11) which returns the Defeat output 472 to logic zero. The next note found during the scan of the counters 8 and 9 will initiate the normal hold state of the system clock output and the next found note will be played in the normal manner.

The Defeat output 472 is programmed to a logic one by a clock pulse on lead 484 which is provided as a result of the operation of logic circuit 466 in response to the static information $\overline{SQ1}$, $\overline{SQ2}$, $\overline{SQ3}$, and the dynamic information X, Y, Z, $\overline{X}$ and $\overline{Y}$. This information when processed by logic circuit 466 results in a Defeat output when a note is to be passed over and the next higher note is to be sounded first in the selected note pattern.

When either note pattern (1) or note pattern (2) is selected, it is convenient to repeat the pattern by resetting the counters 8 and 9 to the initial A1B1 position with a pulse so that the note pattern begins again as though keys had just been played. The $\overline{SQ1} \cdot \overline{SQ2}$ output 474 and the $\overline{Y}$ output 476 are combined as illustrated in FIG. 7B by NAND gate 475 to produce a register reset $(\overline{RR})$ pulse on lead 72 to the clear inputs of flip-flop 70 and 100 in FIG. 2. Then when either $\overline{SQ1}$ or $\overline{SQ2}$ is a logic one and $\overline{Y}$ goes to the logic one, a logic zero pulse is created which resets the counters 8 and 9 to their initial state.

With reference to FIG. 12, the operation of the sequence control 12 can be more readily understood. The various wave forms of the logic information are illustrated and the time sequential sounding of the respective note patterns 1, 2 and 3 is shown. The downbeat (DB) pulse initializes the flip-flops and shortly after an Any Key Played signal is received, $\overline{Search}$ goes to a logic one and the counters 8 and 9 scan to locate the first note to be sounded. The sounding of that note is indicated as a dot on line 1 of the note pattern (1). After the hold state is terminated, $\overline{Search}$ goes to logic zero and X is clocked to logic one and the next note is located. Under note pattern 1, the first series of notes are sounded in an up arpeggio until all four notes are sounded. After all four notes are sounded, the Defeat output goes to logic one and an $\overline{RR}$ pulse is produced on $\overline{RR}$ input 72 to the counters 8 and 9 causing the counters to start counting again from A1B1. However, since a Defeat is momentarily programmed on lead 472, the first note is passed over and the second note is sounded first. The third and fourth notes are then sounded in sequence, and a Reverse Direction signal is produced causing the counters to turn around and start reverse counting until the third note is sounded. Y then goes to logic one ($\overline{Y}$ goes to zero) so that an $\overline{RR}$ pulse is created causing the counter to reset to A1B1 and start counting again producing the sounding of the first note. Similarly, it can be seen how the various logic signals operate to produce note pattern (2) and note pattern (3).

RHYTHM DIVIDER

With reference to FIG. 14, the rhythm divider circuit 13 is illustrated. Rhythm divider circuit 13 is an interface circuit for the sixteenth note strobe pulse from the rhythm unit 20. The sixteenth note strobe pulse from the rhythm unit 20 on input lead 490 is delayed for approximately 20 milliseconds by operation of transistor 492 and transistor 494. The collector of transistor 494 is connect4ed to sixteenth note sync lead 496 which is connected to NAND gate 464 in FIG. 11. As previously pointed out, this operates to latch the downbeat information until the sixteenth note sync transition is detected by transistor 454. The collector of transistor 494 is also connected through an inverter 498 to sixteenth note timing clock pulse lead 201 which is connected as indicated in FIG. 8. The collector of transistor 494 is also connected to the clock input 500 of JK flip-flop 502 which is wired as a divide by two divider. The Q output is connected to lead 203 to FIG. 8 and the $\overline{Q}$ output 504 is connected to the clock input of JK flip-flop 506 which is also wired as a divide by two divider. The Q output is connected to lead 205 to FIG. 8. Lead 203 provides eighth note rhythm pulse and lead 205 provides fourth note rhythm pulse to the clock control circuit in FIG. 8.

The 20 millisecond delay between the strobe pulse from the rhythm unit 20 and the timing outputs 201, 203, and 205 from the rhythm divider 13 is necessary in the case where the lowest note of note pattern (1) or note pattern (2) has been sounded just prior to a rhythm downbeat. The 20 millisecond delay allows the pulser circuit 3 to recover so that the lowest note can always be sounded with (i.e., 20 milliseconds later) the rhythm downbeat.

TOUCH SWITCH LOGIC

For ease and speed of changing the modes of system operation at any instant during musical performance a special capacitance touch switch and the circuit shown in FIG. 15 were conceived and used. The capacitance touch switch 510 incorporates touch electrode 531, and guard electrode 509 which shields the touch electrode from nearby grounded points. The bulk of the capacitance between the touch electrode 531 and ground is eliminated by the presence of the guard electrode 509, thereby facilitating the detection of the small capacitance change occurring when electrode 531 is touched by the musical performer.

The free running clock input 170 from FIG. 8 is supplied to the guard electrode 509 of a touch switch 510 which is a capacitance sensitive device which detects operator to ground capacitance. The touch switch 510 is connected to the electronic circuit by shielded lead 527. The shield on lead 527 is connected to the guard potential to eliminate the capacitance to ground of lead 527. The output 520 of the touch switch circuit, which is connected to the correspondingly numbered lead in FIG. 13, is normally high until the operator contacts the capacitor touch electrode 531, whereupon the output 520 goes low as transistor 522 turns "on." The free running clock applied to 170 is a 100 KHz square wave swinging from zero volts to +5 volts. A D.C. voltage is developed across capacitor 507 by rectification of the clock by diode 518. This voltage is the supply voltage for transistors 512 and 519. Transistor 512 is normally based "on" by current through resistor 508. This causes the emitter of transistor 519 to have an average positive potential. Transistor 514 is turned "on" by this positive potential through resistors 503 and 505, turning "off" transistor 522 and allowing the output terminal 520 to be held high by resistor 525. Capacitor 513 in conjunction with resistors 503 and 505 serves to filter the 100 KHz ripple superimposed upon the control signal at the emitter of transistor 519. When capacitance to ground is applied to the touch electrode 531 by the player's finger, it is charged positively through diode 515 with respect to ground while the square wave from the free running clock on lead 170 is positive. As the square wave goes negative, touch electrode 531 is discharged by forward biasing of diode 511. This forward current of diode 511 reverse bases transistor 512 turning it "off." Capacitor 516 holds transistor 512 "off" when the clock is positive. Without collector current from transistor 512, resistor 517 causes the emitter follower voltage and the average voltage at capacitor 513 to decrease. The voltage drop is amplified by transistors 514 and 522. Positive feedback supplied by resistor 521 is applied to the transistors 514 and 522 to provide hysteresis. Thus the output 520 remains at logic zero as long as the player's finger remains in contact with capacitor touch electrode 531.

With reference to FIG. 13, the touch switch logic circuit 24Q is illustrated. Lead 520 is connected through an inverter 524 to the RR Sync Override lead 416 which is connected to the corresponding lead in FIG. 6. When touch switch output 520 is high, the output of inverter 524 is at zero or "grounded" so that the real rhythm sync switches 374, 375, and 376 in FIG. 6 have a ground return. As previously pointed out with respect to the clock control circuit in FIG. 8, when one of the leads 194, 196 and 198 is at logic zero (grounded) the timing pulses from the rhythm divider 13 trigger the circuits so the notes are sounded at the selected rhythm. If the touch switch 510 is operated so that the touch switch output 520 goes low, the RR sync override lead 416 necessarily goes high to logic one thereby converting rhythm sync to rate control operation of the circuit by causing leads 194, 196, and 198 to go to logic one.

The TS output lead 526 in FIG. 13 is also zero when input 520 is high and vice versa. TS lead 526 is used by the switch interface circuit (FIG. 7A and 7B) to hold the Any Rhythm Sinc (ARS) control lead 393 in FIGS. 7A and 7B to logic zero when the touch mode switch 510 is operated (TS lead 526 goes high but inverter 528 grounds ARS lead 393 in FIG. 7A). The TS signal is also inverted by inverter 530 to inhibit the turning "on" of transistor 532. Transistor 534 is then turned "on" to supply the octave prime voltage Vcc thereby inhibiting octave priming.

The $\overline{TSC}$ output 536 follows the logic of the touch switch input 520. In FIG. 7A and 7B, it can be seen that $\overline{TSC}$ controls the operation of transistor 534 in FIG. 7A so that when the touch switch 510 is operated, octave prime voltage Vcc is supplied on lead 134 connected to the corresponding lead in FIG. 5. The $\overline{TS}$ lead 538 which is connected through inverter 540 to $\overline{RR}$ lead 72 (FIG. 7B) operates at logic zero to override the downbeat resetting of counters 8 and 9.

The Normal Mode of operation of the organ is detected by a logic one on Norm lead 542 to NAND gate 544 (FIG. 13) to enable conversion to the arpeggio up mode with touch switch operation. In this mode, Two Direction Enable TDE lead 300 (FIG. 7B) is held at a logic zero (when $\overline{TSB}$ lead 546 goes to logic zero) for single direction scanning. TSE lead 548 (FIG. 13) goes to logic zero to override the normal mode NM output 424 in FIG. 7B. $\overline{PC}$ lead 550 and $\overline{TSBP}$ lead 552 produce logic zero pulses when the touch switch input 520 goes from logic zero back to logic one as the operator releases the touch switch 510. The $\overline{PC}$ pulse clears the counter 8 and 9 shift registers 70 and 100 by supplying a pulse on $\overline{RR}$ lead 72. The $\overline{TSBP}$ pulse blanks voice sounding (shuts off transistors 434 and 436 in FIG. 7B) if keys are held while going to the normal mode from the touch switch mode. An output on TS NKT lead 372 triggers the new key detector circuit 15 (see FIG. 10) as if keys had just been played so that the arpeggio starts without keyboard retriggering when the touch siwtch is operated.

If any of the note pattern switches 377, 378 or 379 (FIG. 6) are operated, the ASM lead 413 (to FIG. 13) goes to a logic one. Upon operation of touch switch 510, the output of NAND gate 554 (FIG. 13) goes to logic zero so that sequence Enable lead 556 goes to logic one to override the note pattern programmed (by removing ground from switches 377, 378 and 379 in FIG. 6), switching from the note pattern mode to arpeggio up/down.

The TS NKT lead 372 provides a logic zero pulse to trigger the new key detector 15 (see FIG. 19) and Seq. Count Reset lead 460 operates on the sequence control circuit 12 in FIG. 11 to initialize flip-flops 440, 442, and 444 so that when the touch switch 510 is released, the note pattern will start from the beginning.

Multi-injection enable [A]ME and [B]ME circuit 10 (FIG. 2) is overriden by $\overline{TSF}$ on lead 558 and $\overline{TSG}$ on lead 560. With reference to FIG. 7A and 7B, it can be seen that zero logic on $\overline{TSF}$ lead 558 and zero logic on $\overline{TSG}$ lead 560 produce a logic one output on multi-injection enable leads 420 and 422 respectively.

Repeat Enable lead 562 in FIG. 13 is shown in FIG. 7B to be the logic combination of Start plus Rpt by operation of inverters 561 and 563 and transistor 565. $\overline{Repeat}$ is programmed with a logic zero on lead 330 when logic one appears at the inputs of NAND gate 564. At the same time, inverter 566 produces a zero input pulling (up/down) TSA lead 572 to logic zero while inverter 568 pulls the touch chromatic output lead 570 to logic zero. Either an up/down or an up arpeggio mode is detected on inputs 572 and 574 to NAND gate 576. With reference to FIG. 7A and 7B and FIG. 6, it can be seen that leads 572 and 574 are respectively connected to the arpeggio switches 384 and 385. Operation of the touch switch overrides the arpeggio and converts an arpeggio to a chromatic scale by supplying voltage on lead 570 to the base of transistor 124 in FIG. 5 in each of the octave prime coupler circuits 6. This produces an effect as if all keys switches had been actuated so that as the counters 8 and 9 scan, each note of the scale is sounded in chromatic order. The touch chromatic mode of operation is overriden if positive logic is supplied on the organ mode OM lead 578 which is inverted by inverter 580 to produce zero logic on touch chromatic lead 570. The organ mode is programmed by the operation of organ mode switch 386 in FIG. 6. The multi mode of operation also overrides the touch chromatic operation. In the multi mode, TSF lead 558 goes to logic one and inverter 582 holds the touch chromatic lead 570 at logic zero.

The foregoing description has primarily dealt with the operation of the circuit to produce an arpeggio. In addition, the modifications of the arpeggio necessary to generate note patterns were described. Other modifications of the arpeggio operation can now be shown which result in the normal mode of operation, the organ mode of operation, and the multi mode of operation.

The normal mode output of the switch interface 24 (FIG. 7A and 7B) is NM lead 424 to counters 8 and 9 in FIG. 2. For the normal mode, the NM output 424 is at logic one. Inverter 426 (FIG. 2) holds both shift registers 70 and 100 in clear so that the Q outputs of the shift registers 70 and 100 are held at logic zero. Further, at logic one on NM lead 426 clamps the outputs of gates 80, 81, 104 and 105 and inverters 90-93 and 106-113 to logic zero. The result is that both inputs to NOR gates 82-89 and 106-113 are at logic zero so that all 16 outputs A1-A8, B1-B8 are at logic one. The logic circuit 20 now enables all 61 of the decoder circuits 2 and pulser circuits 3 so that note sounding is a function of the operation of the key switches 17 only.

The organ mode of operation is an arpeggio operation except that the scan of the counters 8 and 9 is not halted when a note is "found." The system clock is always in the search mode so that each note is enabled for only 10 microseconds on each scan. Therefore, each note is enabled every 640 microseconds. If a decoder circuit 2 is enabled by operation of a key switch 17, the keyer 1 is slowly turned on by the build up of charge on capacitor 144 (FIG. 5) of pulser circuit 3 (at a 1/64 duty cycle). To compensate for the lower duty cycle, a higher DC voltage is applied to the note played trigger bus 40 to the emitter of transistor 140 and the note sounds at a volume comparable to the percussive volume. The volume compensating voltage is between 15 to 22 volts and adjustment of the sustain pot 24K on lead 168 determines the specific voltage.

In the organ mode of operation, it is necessary to disable note found detection in the clock control circuit 7 (FIG. 8) so that the hold state of the system clock does not occur. During the organ mode, transistor 273 is held in saturation because $\overline{OM}$ is at logic zero so that bias voltage is applied to the base of transistor 273. The emitter of transistor 273 is raised to 15 to 22 volts and the +9 volts through 4.7K resistor 277 applies base current through the base of transistor 273. The note played trigger current on note played trigger bus 40 from pulser 3 is shunted around the emitter-base junction of transistor 188. The tone in the organ mode sounds with slow attack when the key is closed and continues to sound as long as the key is held. Both octave priming and sustain control functions as they do in the percussive modes.

The multi mode of operation permits the simultaneous sounding of multiple notes in a sequence. In the arpeggio mode of operation, the counters 8 and 9 circulate the truth table code illustrated in FIG. 16. So that the An Bn outputs progress from A1B1 to A8B8 (and back again in an up/down arpeggio). Only one An Bn output is enabled at any given moment. In the multi mode of operation, the code circulating from the counters 8 and 9 is altered by the multi-inject circuits 10 so that more than one given output An Bn is enabled at a given moment. The output code for the counters 8 and 9 in the multi mode is illustrated in FIG. 17. The multi-injection circuits 10 are shown in FIG. 2. The operation of both [A] and [B] multi-injection circuits is identical so only the [A] multi-injection circuit will be described. The [A] multi-injection circuit 10 is enabled with a logic zero on lead 420 from the logic interface circuits of FIG. 7. The active outputs from the multi-injection circuit are logic zero to override the normal logic one input to the shift register 70.

In the up direction of matrix scan (S/$\overline{L}$ at logic one), the input to shift register 70 is accepted at the J and $\overline{K}$ inputs. A zero output from NAND gate 590 on lead 591 is present when A2 is logic 1, A4 is logic zero and the multi-injection circuit is enabled by a logic zero on lead 420. Initially A1 is logic 1 and on the next clock A1 goes to logic 0 and A2 goes to logic 1. Since A4 is already at logic 0 at this time, the output of NAND gate 590 goes to logic 0 to override the normal logic 1 input to the shift register 70. With the next clock pulse, the shift register 70 outputs on QA, QB, QC, and QD will be shown in the middle column of FIG. 17. Successive clock pulses produce inverted QD outputs at the QA output. This new code is self-sustaining (periodic) in ring counter operation, without further intervention. A4 is detected by the multi-injection circuit by NOR gate 592 to prevent secondary intervention which would alter the content of the code circulation. Multi-code is removed when the shift register is cleared by releasing all key switches.

In down or reverse operation, the multi-injection circuit output from NAND gate 594 is active (zero) and is connected to the D input of shift register 70 by lead 595. When enabled by detection of A8 at logic 1, the output of NAND gate 590 is active (logic zero) and alters the normal code circulation. A6 is detected by NAND gate 596 to prevent secondary intervention. The A1-A8 code produced is shown in FIG. 17. Thus, as can be seen, if the appropriate key switches are operated, more than one note can be sounded at the same time in the multi mode of operation. At various appropriate locations in the text the typical temporary changes in mode of operation resulting from touch switch actuation have been described. They can be summarized in the following table:

| Mode Changes With Touch Switch Operation | |
|---|---|
| From | To |
| Normal | Arpeggio Up |
| Strum | Arpeggio Up |
| Argeggio-Up | Chromatic Scale |
| Arpeggio-Up/Down | Chromatic Scale |
| Note Patern 1, 2 or 3 | Arpeggio Up/Down |
| Any rhythm sync | Rate Set by control panel potentiometer |

It should be expressly understood that various changes, modifications, and alterations of the preferred embodiment illustrated and described herein may be made without departing from the spirit and scope of the present invention as defined in the appended claims.

I claim:

1. A touch operated capacitance switch arrangement for use in connection with an electronic musical instrument having a plurality of modes of operation comprising:

a touch electrode;
a guard electrode interposed between said touch electrode and nearest points of ground potential;
a source of alternating voltage;

circuit means for applying said alternating voltage to said guard electrode and said touch electrode, said guard electrode cooperating with said alternating voltage to reduce the capacitance of said touch electrode to ground; said circuit means further comprising;

means to detect increased current flow to said touch electrode when said touch electrode is touched by a human extremity; and an output terminal connected to said means to detect, said output terminal caused to have a voltage potential at a first state by said detector means when said touch electrode is not touched, and caused to have a voltage potential at a second state by said detector means when said touch electrode is touched, said output terminal connected to said electronic musical instrument such that the mode of operation of said electronic musical instrument is changed when said voltage of said output terminal goes from said first state to said second state.

2. A touch operated capacitance switch arrangement as claimed in claim 1, wherein said changed mode of operation of said electronic musical instrument continues only so long as said touch electrode is touched, and said output terminal returns to said first state when said touch electrode is no longer touched, and the mode of operation of said electronic musical instrument returns to its original mode of operation.

3. A touch operated switch arrangement, as claimed in claim 1 wherein said means to detect comprises an array of transistor switch means arranged between said touch electrode and said output terminal for detecting increased current flow to said touch electrode when said touch electrode is touched and switching the voltage potential of said output terminal from said first state to said second state.

* * * * *

UNITED STATES PATENT AND TRADEMARK OFFICE
CERTIFICATE OF CORRECTION

PATENT NO. : 4,176,575  
DATED : December 4, 1979  
INVENTOR(S) : Walter Munch

It is certified that error appears in the above-identified patent and that said Letters Patent are hereby corrected as shown below:

In the Caption of the Patent, entry [73], Assignee: "D. H. Baldwin & Company" should read --D. H. Baldwin Company--.

In the Abstract, line 32, "provided is" should read --is provided--.

Column 2, line 61, "connected" should read --connection--.

Column 2, line 66, "operated" should read --operable--.

Column 11, line 25, "Khz" should read --KHz--.

Column 11, line 35, "input" should read --output--.

Column 12, line 66, "lne" should read --line--.

Column 13, line 28, "of" should read --to--.

Column 13, line 31, "of" should read --by--.

Column 14, line 8, "226" should read --266--.

Column 14, line 37, "cae" should read --case--.

Column 14, line 62, "to" should read --at--.

Column 17, line 54, "invertes" should read --inverts--.

Column 20, line 36, "buttom" should read --button--.

Column 21, line 45, "$[\overline{\overline{SQ1}}$" should read --$[(\overline{\overline{SQ1}}$--.

UNITED STATES PATENT AND TRADEMARK OFFICE
CERTIFICATE OF CORRECTION

PATENT NO. : 4,176,575

DATED : December 4, 1979

INVENTOR(S) : Walter Munch

It is certified that error appears in the above-identified patent and that said Letters Patent are hereby corrected as shown below:

Column 21, line 64, "A1B1" should read --A1-B1--.

Column 23, line 12, "Vccz" should read --VccZ--.

Column 25, line 9, "8." should read --8).--.

Column 25, line 35, "A1B1" should read --A1-B1--.

Column 25, line 68, "Y" should read --$\overline{Y}$--.

Column 26, line 1, "$\overline{Y}$" should read --Y--.

Column 26, line 15, "connect4ed" should read --connected--.

Column 28, line 18, "siwtch" should read --switch--.

Column 28, line 31, "FIG. 19" should read --FIG. 10--.

Column 29, line 60, "A1B1" should read --A1-B1--.

Column 30, line 51, "Patern" should read --Pattern--.

Column 31, line 6, ";" should read --:--.

Signed and Sealed this

Sixth Day of May 1980

[SEAL]

Attest:

SIDNEY A. DIAMOND

Attesting Officer

Commissioner of Patents and Trademarks